United States Patent
Kim et al.

(10) Patent No.: US 12,219,715 B2
(45) Date of Patent: Feb. 4, 2025

(54) SYSTEM AND METHOD FOR MANUFACTURING COMPOSITE BOARD

(71) Applicant: DOOSAN CORPORATION, Seoul (KR)

(72) Inventors: Sungmoon Kim, Yongin-si (KR); Jinwoo Kim, Yongin-si (KR); Sanghwa Kim, Yongin-si (KR); Euidock Ryu, Yongin-si (KR); Hyungrae Roh, Yongin-si (KR)

(73) Assignee: DOOSAN CORPORATION, Seoul (KR)

(*) Notice: Subject to any disclaimer, the term of this patent is extended or adjusted under 35 U.S.C. 154(b) by 433 days.

(21) Appl. No.: 17/622,551

(22) PCT Filed: Jun. 25, 2020

(86) PCT No.: PCT/KR2020/008270
§ 371 (c)(1),
(2) Date: Apr. 20, 2022

(87) PCT Pub. No.: WO2020/262979
PCT Pub. Date: Dec. 30, 2020

(65) Prior Publication Data
US 2022/0353999 A1 Nov. 3, 2022

(30) Foreign Application Priority Data
Jun. 25, 2019 (KR) .................. 10-2019-0075969

(51) Int. Cl.
*H05K 3/28* (2006.01)

(52) U.S. Cl.
CPC ......... *H05K 3/28* (2013.01); *H05K 2203/166* (2013.01)

(58) Field of Classification Search
CPC .. H05K 3/28; H05K 3/281; H05K 2203/0195; H05K 2203/166
See application file for complete search history.

(56) References Cited

FOREIGN PATENT DOCUMENTS

| CN | 101730392 A | 6/2010 |
|---|---|---|
| CN | 104936381 A | 9/2015 |
| JP | 2008-111860 A | 5/2008 |
| JP | 2009-21271 A | 1/2009 |
| JP | 2010-98075 A | 4/2010 |
| KR | 20-0420975 Y1 | 7/2006 |
| KR | 20-0421129 Y1 | 7/2006 |
| KR | 10-0808674 B1 | 2/2008 |

(Continued)

OTHER PUBLICATIONS

European Patent Office, Communication dated Sep. 29, 2023, issued in EP application No. 20832810.4.

(Continued)

*Primary Examiner* — George R Koch
(74) *Attorney, Agent, or Firm* — Sughrue Mion, PLLC

(57) ABSTRACT

A system for manufacturing a printed circuit board includes a coverlay supply apparatus configured to supply a coverlay; a printed circuit board supply apparatus configured to supply a printed circuit board; and a pre-bonding apparatus configured to pre-bond the coverlay supplied from the coverlay supply apparatus onto the printed circuit board supplied from the printed circuit board supply apparatus, thereby discharging a first composite board.

16 Claims, 20 Drawing Sheets

(56) References Cited

FOREIGN PATENT DOCUMENTS

| | | |
|---|---|---|
| KR | 10-2013-0030372 A | 3/2013 |
| KR | 10-2013-0128949 A | 11/2013 |
| KR | 10-1401984 B1 | 5/2014 |
| KR | 10-2015-0025201 A | 3/2015 |
| KR | 10-2015-0058939 A | 5/2015 |
| KR | 10-2018-0038645 A | 4/2018 |
| WO | WO-2005100220 A1 * 10/2005 | ......... B32B 38/1841 |

OTHER PUBLICATIONS

Office Action dated Jan. 13, 2023 from the Japanese Patent Office in JP Application No. 2021-576815.
International Search Report for PCT/KR2020/008270 dated Oct. 29, 2020 (PCT/ISA/210).

* cited by examiner

SYSTEM AND METHOD FOR MANUFACTURING COMPOSITE BOARD

This application is a National Stage of International Application No. PCT/KR2020/008270 filed Jun. 25, 2020, claiming priority based on Korean Patent Application No. 10-2019-0075969 filed Jun. 25, 2019.

TECHNICAL FIELD

The present invention relates to a system and a method for manufacturing a composite board and, specifically, to a system and a method for manufacturing a composite board by automating a pre-bonding process and a hot-pressing process, which are dualized, into a continuous process.

BACKGROUND ART

In general, a flexible printed circuit board (FPCB) is a flexible board in which a circuit pattern is printed on a flexible insulating board. The FPCB is bendable, and thus, the FPCB enables three-dimensional wiring and efficient space utilization, thereby facilitating miniaturization and weight reduction. Therefore, flexible printed circuit boards are widely used in electronic products mounted to thin and slim parts, such as printers, cameras, and various mobile products.

In order to protect the printed circuit pattern on the flexible printed circuit board, a coverlay film such as a polyimide film is pre-bonded to the surface of a flexible copper clad laminate (FCCL) by a pre-bonding apparatus, and then hot-pressed by a hot-press apparatus. At this time, the pre-bonding process time by the pre-bonding apparatus is about 30 to 60 seconds, and the hot-pressing process time by the hot-press apparatus is about 240 to 300 seconds, so there is a difference in the tack time between the two processes. Therefore, when the coverlay is pre-bonded to the printed circuit board by a roll-to-roll method and then bonded thereto, the printed circuit board to which the coverlay is pre-bonded by the pre-bonding apparatus cannot be transferred to the hot-press apparatus due to the difference in the tack time from the hot-pressing process, thereby being stalled, which causes the printed circuit board to sag, resulting in a defect. For this reason, in the prior art, it was impossible to continuously and automatically supply the printed circuit board pre-bonded in the pre-bonding apparatus to the hot-press apparatus. Instead, the printed circuit board pre-bonded in the pre-bonding apparatus was stored separately in a roll form, and the roll was moved to the hot-press apparatus and then unwound to supply the printed circuit board to the hot-press apparatus to perform a hot-pressing process, so the productivity was lowered.

DISCLOSURE OF INVENTION

Technical Problem

An aspect of the present invention is to provide a composite board manufacturing system capable of manufacturing a composite board by automating a pre-bonding process and a hot-pressing process, which are dualized, into a continuous process, and a method thereof.

Solution to Problem

In view of the foregoing, the present invention provides a system for manufacturing a composite board, which includes: a coverlay supply apparatus configured to supply a coverlay; a printed circuit board supply apparatus configured to supply a printed circuit board; and a pre-bonding apparatus configured to pre-bond the coverlay supplied from the coverlay supply apparatus onto the printed circuit board supplied from the printed circuit board supply apparatus, thereby discharging a first composite board.

In addition, the present invention provides a method for manufacturing a composite board, which includes: a coverlay supply step of supplying a coverlay from a coverlay supply apparatus; a printed circuit board supply step of supplying a printed circuit board from a printed circuit board supply apparatus; and a pre-bond step of pre-bonding the coverlay supplied in the coverlay supply step onto the printed circuit board supplied in the printed circuit board supply step to form a first composite board.

Advantageous Effects of Invention

A composite board manufacturing system according to the present invention is able to manufacture a composite board in a coverlay-printed circuit board structure by unifying a pre-bonding process and a hot-pressing process, which are dualized, through an automatic and continuous roll-to-roll method.

DRAWING LEGEND INSERTION

100: Coverlay supply apparatus
110: Coverlay film supply unit,
111: Coverlay film supply roller part, 112: First tension adjustment roller part,
113: First splicing part, 114: Second cleaning roller part,
115: First guide roller part, 116: Release substrate collecting roller part,
120: Cutting unit,
121: Plate support part, 122: Upper plate part,
123: Lower plate part, 124: Upper plate transfer part,
130: Separation unit,
131: Delamination plate part, 132: Release substrate guide roller part,
133: Air blower, 134: Ionizer,
200: Printed circuit board supply apparatus,
210: Printed circuit board supply roller part, 220: Inserted-paper collecting roller part,
230: Second guide roller part, 240: Second tension adjustment roller part,
250: Second splicing part, 260: Second cleaning roller part,
270: Second ionizer part,
300: Pre-bonding apparatus,
310: Coverlay seating unit;
311: Seating table part, 312a and 312b: Pair of rail parts;
313: Transfer body part, 314: Coverlay clamp part,
315: Transfer body driving part,
320: Pickup transfer unit,
321: Pickup transfer body part, 322: Transfer part, 323: Pickup part,
330: Aligning table unit,
331: Aligning table part,
332a and 332b: First and second printed circuit board clamp parts,
333: Auxiliary pre-bonding part, 334: Auxiliary aligning table part,
340: Pre-bonding unit,
341: Pre-bonding housing part, 342: Upper support part,
343: Upper pre-bonding part, 344: Lower support part,
345: Lower pre-bonding part, 346: Driving part,
347a and 347b: First and second pre-bond clamp parts,
350: First vision unit,
360: Second vision unit;
400: Transfer apparatus,
410: Transfer body part,
420: First transfer guide roller part,
430: Second transfer guide roller part,
440: Rail part,
450: Transfer clamp part,
460: Clamp driving part,
500: Hot-press apparatus,
510: Protection film supply unit,
511: First film supply roller part, 512: Second film supply roller part,
513: Board guide roller part,
520: Hot-press unit,
521: Hot-press housing part, 522: Upper press part,
523: Lower press part,
530: Protection film collecting unit,
531: First film collecting roller part, 532: Second film collecting roller part,
533: Film collecting guide roller part,
600: Winding apparatus,
610: Inserted-paper supply roller part,
620: Board collecting roller part,
630: Edge controller

BEST MODE FOR CARRYING OUT THE INVENTION

Hereinafter, the present invention will be described

Figure 1:
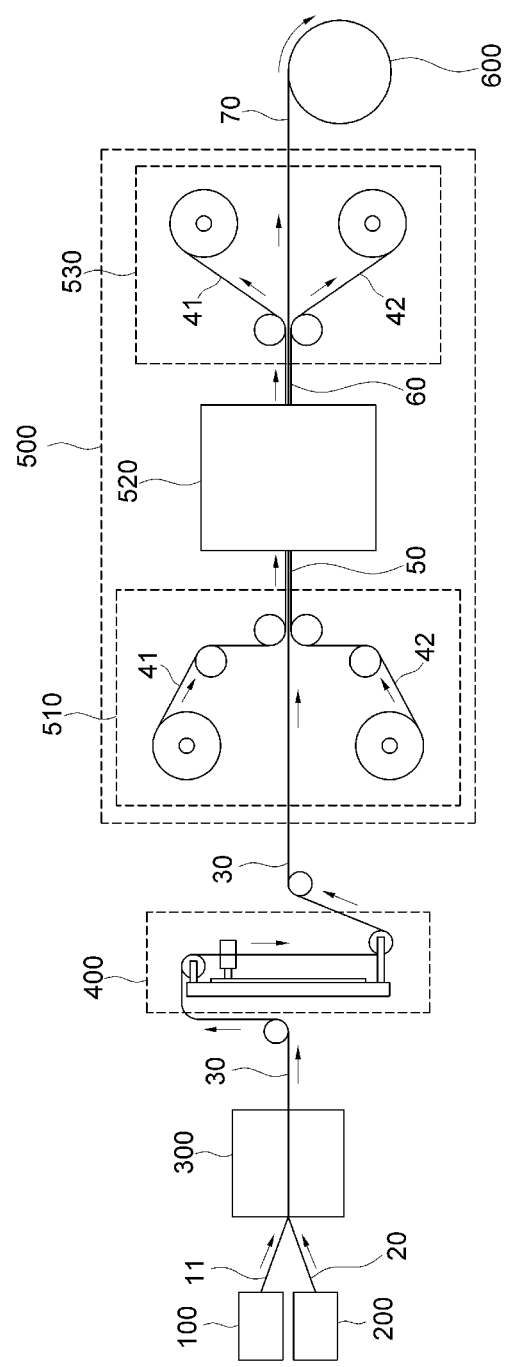
FIG. 1 is a schematic diagram schematically illustrating a system for manufacturing a composite board according to the present invention.
Figure 2:
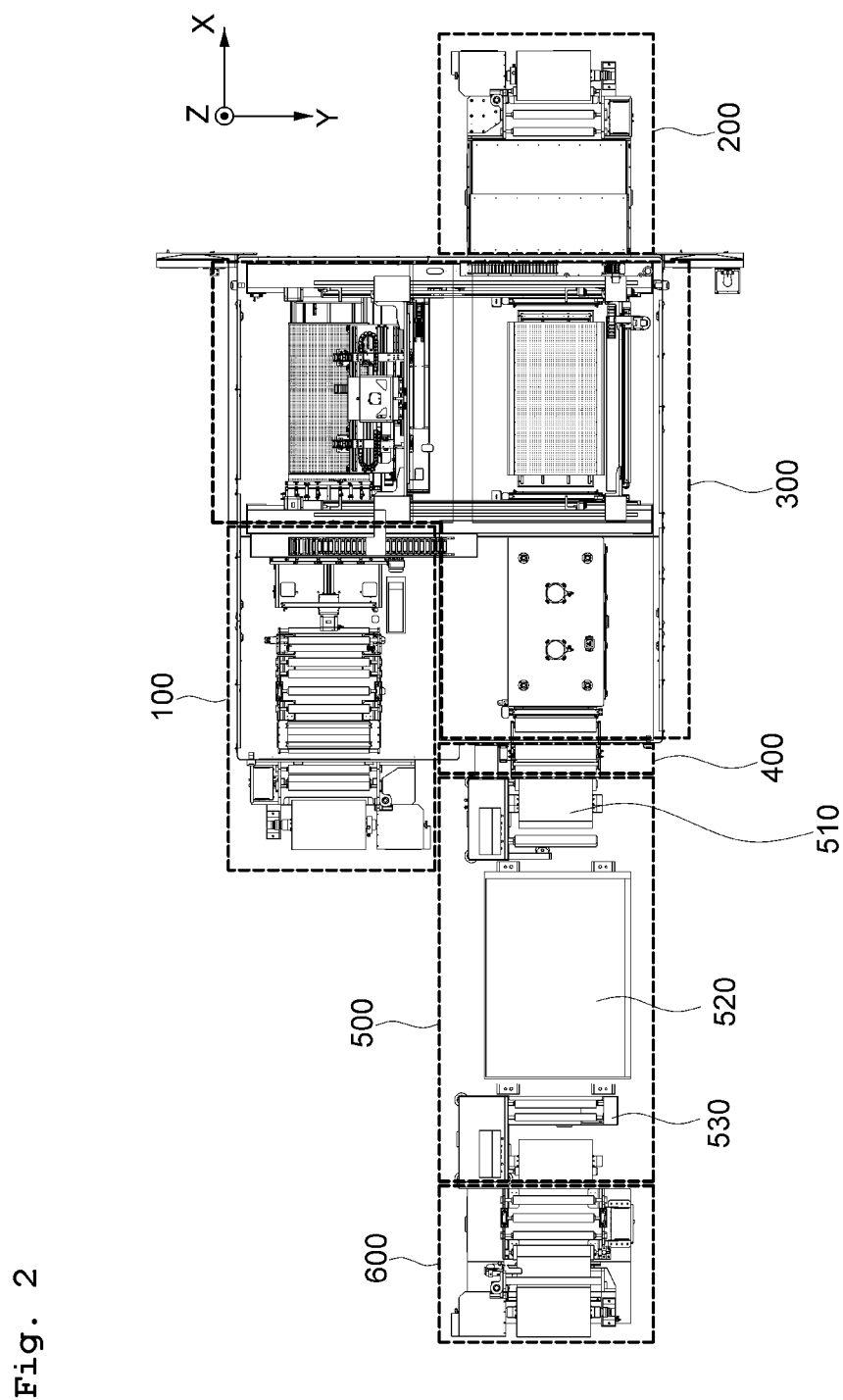
FIG. 2 is a plan view illustrating a system for manufacturing a composite board according to the present invention.

FIG. 1 is a schematic diagram schematically illustrating a system for manufacturing a printed circuit board according to the present invention. FIG. 2 is a plan view illustrating a system for manufacturing a printed circuit board according to the present invention.

As shown in FIGS. 1 and 2, a system for manufacturing a printed circuit board according to an example of the present invention includes: a coverlay supply apparatus 100 for supplying a coverlay 11; a printed circuit board supply apparatus 200 for supplying a printed circuit board 20; and a pre-bonding apparatus 300 for pre-bonding the coverlay 11 supplied from the coverlay supply apparatus 100 onto the printed circuit board 20 supplied from the printed circuit board supply apparatus 200 and thereby discharging a first composite board 30.

As shown in FIGS. 1 and 2, a system for manufacturing a printed circuit board according to the present invention may include: a coverlay supply apparatus 100 for supplying a coverlay 11; a printed circuit board supply apparatus 200 for supplying a printed circuit board 20; a pre-bonding apparatus 300 for pre-bonding the coverlay 11 supplied from the coverlay supply apparatus 100 onto the printed circuit board 20 supplied from the printed circuit board supply apparatus 200 and thereby discharging a first composite board 30; a hot-press apparatus 500 for hot-pressing the first composite board 30 transferred from the pre-bonding apparatus 300 and thereby discharging a second composite board 70; a transfer apparatus 400 disposed between the pre-bonding apparatus 300 and the hot-press apparatus 500 to adjust the supply amount of the first composite board 30 while transferring the first composite board 30 into the hot-press apparatus 500, and may further include a winding apparatus 600 selectively winding the second composite board 70 discharged from the hot-press apparatus 500.

Hereinafter, respective configurations of the system for manufacturing a printed circuit board according to the present invention will be described with reference to FIGS. 1 to 20.

(1) Coverlay Supply Apparatus

As shown in FIGS. 1 and 2, the coverlay supply apparatus 100 is a device for supplying the coverlay 11 from a coverlay film 10. Specifically, the coverlay supply apparatus 100 cuts the coverlay 11 from the coverlay film 10 to a specific size and separates the same from a release substrate 12 to supply the same.

The coverlay supply apparatus 100 includes a coverlay film supply unit 110, a cutting unit 120, and a separation unit 130 as shown in FIGS. 3 to 7.

Figure 3:
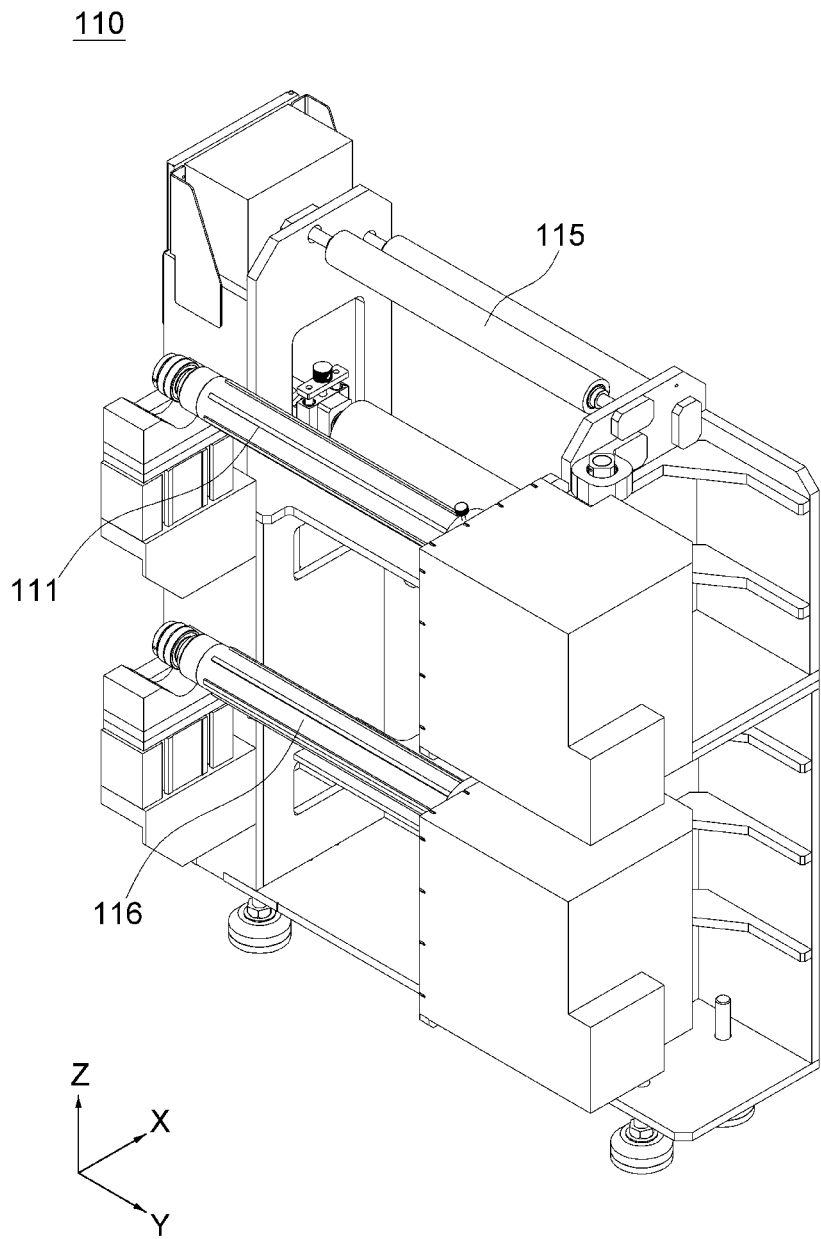
FIG. 3 is a perspective view illustrating a part of a coverlay supply unit in the coverlay supply apparatus shown in FIG. 2.
Figure 4:
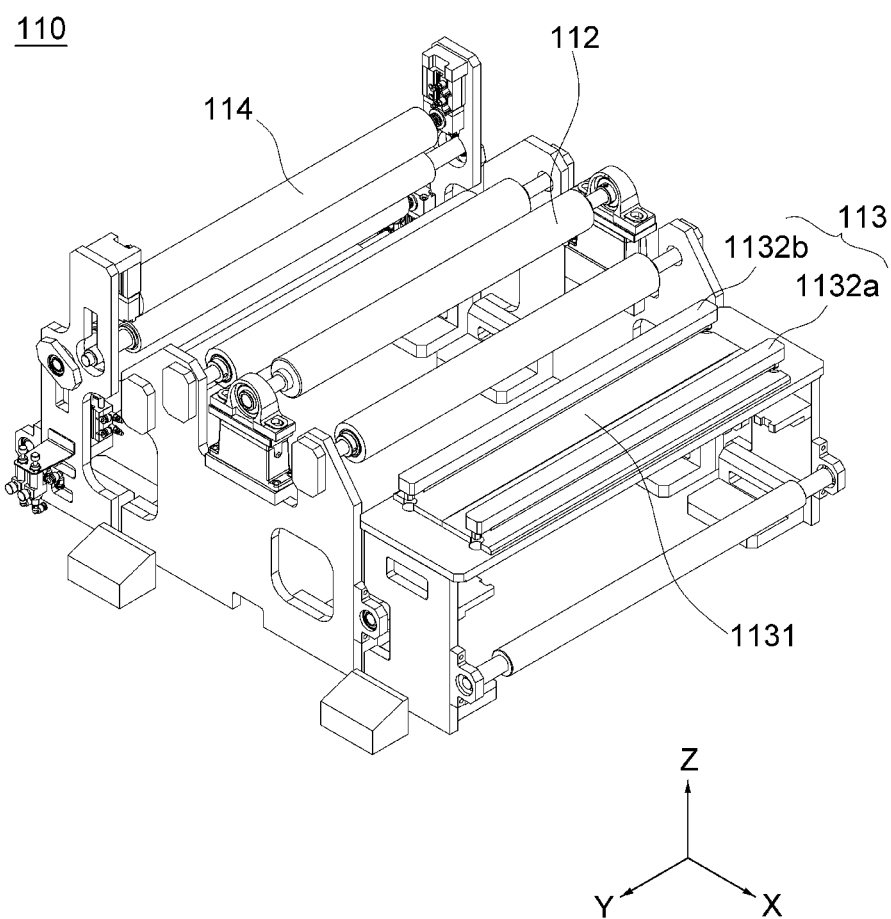
FIG. 4 is a perspective view illustrating the remaining parts of the coverlay supply unit in the coverlay supply apparatus shown in FIG. 2.

As shown in FIGS. 3 and 4, the coverlay film supply unit 110 automatically and continuously supplies a coverlay film 10 to the cutting unit 120, and may include a coverlay film supply roller part 111, and may further include any one of a first tension adjustment roller part 112, a first splicing part 113, a first cleaning roller part 114, a first guide roller part 115, and a release substrate collecting roller part 116 as necessary.

According to an example, the coverlay film supply unit 110 includes a coverlay film supply roller part 111, a first tension adjustment roller part 112, a first splicing part 113, a first cleaning roller part 114, a first guide roller part 115, and a release substrate collecting roller part 116 (see FIGS. 3 and 4).

As shown in FIG. 3, the coverlay film supply roller part 111 is an unwinder roller that continuously releases the coverlay film 10 mounted in a roll form and supplies the same to the cutting unit 120. The coverlay film supply roller part 111 is a swing type so that the roll-type coverlay film 10 may be easily replaced.

The coverlay film 10 usable in the present invention includes a coverlay 11 and a release substrate 12 disposed on one surface thereof. In this case, the examples of the coverlay 11 and the release substrate 12 are not particularly limited as long as they are known in the art, and for example, the coverlay 11 may be a polyimide film and the release substrate 12 may be a PET (polyethylene terephthalate) film.

The first tension adjustment roller part 112 is a guide roller and a roller capable of changing the vertical position thereof. Specifically, as shown in FIG. 4, the first tension adjustment roller part 112 is disposed between the coverlay film supply roller part 111 and the cutting unit 120, more specifically, between the first splicing part 113 and the cutting unit 120 to guide the coverlay film 10 supplied from the coverlay film supply roller part 111 to the cutting unit 120. At this time, the first tension adjustment roller part 112 may change in the height of the roller thereof by moving vertically according to the tension of the coverlay film 10 detected by a load cell. Accordingly, the tension of the coverlay film 10 may be constantly maintained by the coverlay film supply roller part 111. As described above, the first tension adjustment roller part 112 may guide the coverlay film 10 supplied from the coverlay film supply roller part 111 to the cutting unit 120 at a constant speed.

The first splicing part 113 cuts the coverlay film 10 supplied from the coverlay film supply roller part 111 or splices the end of a new coverlay film 10 to the end of an existing coverlay film 10 when replacing the coverlay film supply roller part 111. As shown in FIG. 4, the first splicing part 113 is disposed adjacent to the coverlay film supply roller part 111 between the coverlay film supply roller part 111 and the cutting unit 120.

According to an example, the first splicing part 113 includes: a plate member 1131; 1A-clamp member 1132a disposed on the plate member 1131 in a direction (e.g., the y-axis direction) intersecting the loading direction (the x-axis direction) of the coverlay film 10; and a 1B-clamp member 1132b disposed on the plate member 1131 to be spaced apart from the 1A-clamp member 1132a. At this time, although not shown, the 1A- and 1B-clamp members 1132a and 1132b may be opened and closed according to the hydraulic pressure applied to a hydraulic cylinder by a pressure control valve, but are not limited thereto.

The first cleaning roller part 114 is disposed between the coverlay film supply roller part 111 and the cutting unit 120, for example, as shown in FIG. 4, between the first tension adjustment roller part 112 and the cutting unit, to remove foreign substances from the surface of the coverlay 11 of the coverlay film 10 supplied from the coverlay film supply roller part 111, and may include a plurality of roller members of which the surfaces are coated with adhesive. The vertical position of the first cleaning roller part 114 may be adjusted according to the hydraulic pressure applied to the hydraulic cylinder by the pressure control valve, but is not limited thereto.

The first guide roller part 115 is a roller for guiding the coverlay film 10 supplied from the coverlay film supply roller part 111 to the cutting unit 120, and may be disposed between the coverlay film supply roller part 111 and the cutting unit 120. According to an example, one or more first guide roller parts 112 are disposed between the coverlay film supply roller part 111 and the first splicing part 113, as shown in FIG. 3, and guide the coverlay film 10 supplied from the coverlay film supply roller part 111 to the first splicing part 114.

The release substrate collecting roller part 116 is a roller for winding and collecting the release substrate 12 separated from the coverlay film 10 by a delamination plate part 131 of the separation unit 130. As shown in FIG. 3, The release substrate collecting roller part 116 is positioned below the coverlay film supply roller part 111 of the cover film supply unit 110, but is not limited thereto.

Figure 5:
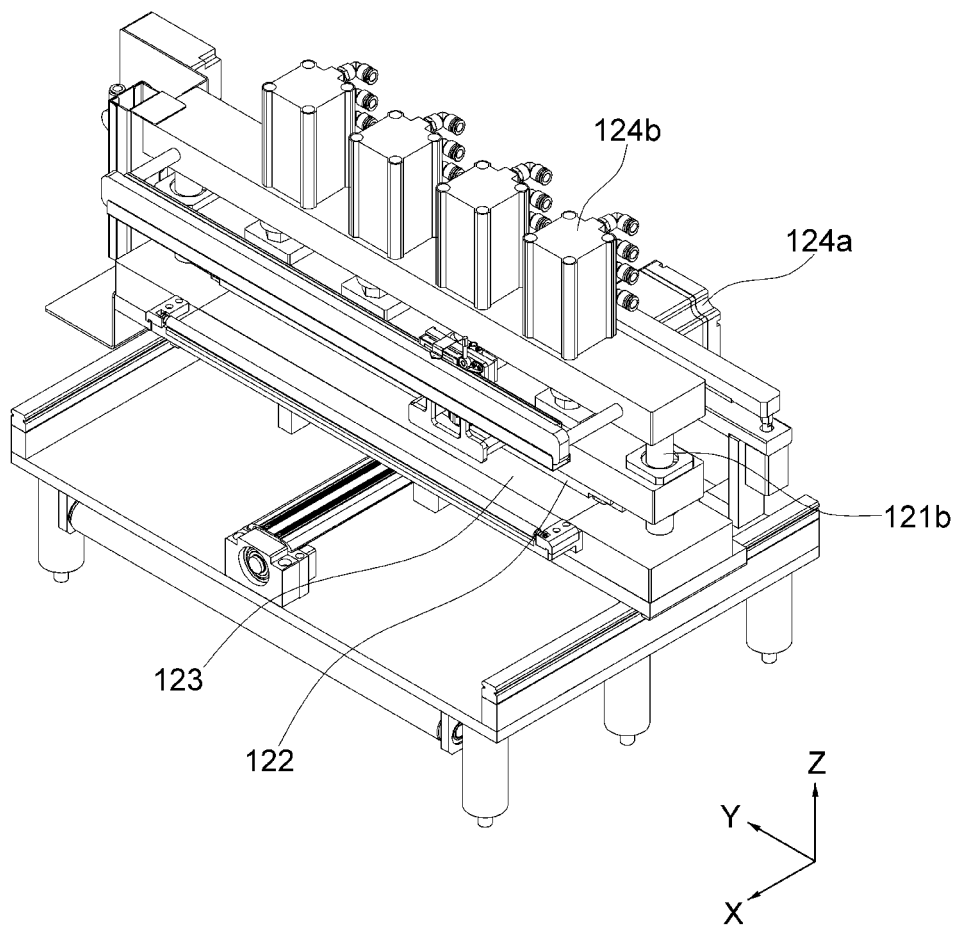
FIG. 5 is a perspective view illustrating a cutting unit of the coverlay supply apparatus shown in FIG. 2.

The cutting unit 120 may cut only the coverlay 11 of the coverlay film 10 supplied from the coverlay film supply unit 110 in a direction (e.g., the Y-axis direction) intersecting the loading direction (the X-axis direction) of the coverlay film and supply the coverlay 11 having a predetermined length to the pre-bonding apparatus 300 (i.e., the separation unit 130). As shown in FIG. 5, the cutting unit 120 includes a pair of plate support parts 121, 121a, and 121b, an upper plate part 122, a lower plate part 123, and an upper plate transfer part 124.

The upper plate part 122 is installed on the upper ends of the pair of plate support parts 121. The upper plate part 122 is respectively supported by the pair of plate support parts 121 on both sides thereof, and drives up and down to cut the coverlay 11 that is stationed on the lower plate part 123.

Figure 6:
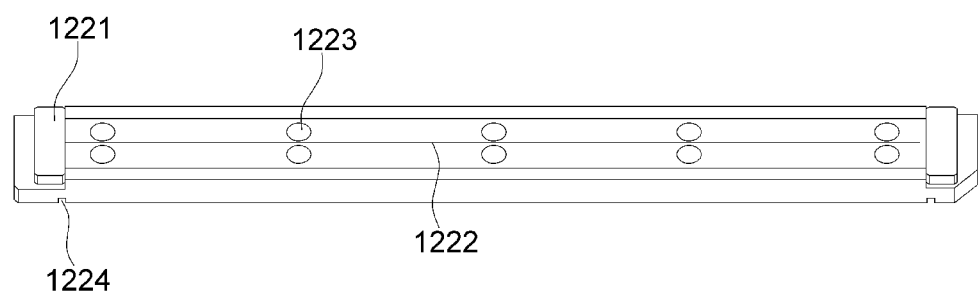
FIG. 6 is a plan view illustrating an upper plate part of the cutting unit shown in FIG. 5.

According to an example, as shown in FIG. 6, the upper plate part 122 includes: a first plate member 1221 in the form of a long plate; a knife 1222 (e.g., a SUS blade) mounted to the first plate member 1221 to cut the coverlay 11; a plurality of magnets 1223 fixing the knife 1222 to the first plate member 1221; and a stopper 1224 to stop the first plate member 1221 at a predetermined descending position.

The lower plate part 123 is installed at the lower ends of the pair of plate support parts 121 and is disposed to face the upper plate part 122. The coverlay film 10 clamped by a clamp part (not shown) is seated on the lower plate part 123 such that the coverlay 11 is cut by the descending upper plate part 122. The lower plate part 123 includes a second plate member in the form of a long plate.

The upper plate transfer part 124 drives the upper plate part 122 vertically. The upper plate transfer part 124 includes a servomotor 124a and a cylinder 124b, but is not limited thereto.

The separation unit 130 separates the coverlay 11, which has been cut to a predetermined size, from the release substrate 12 in the coverlay film 10 in which the coverlay 11 has been cut to a predetermined length by the cutting unit 120. The coverlay 11 supplied from the separation unit 130 to the pre-bonding apparatus 300 indicates a coverlay unit having a predetermined length.

Figure 7:
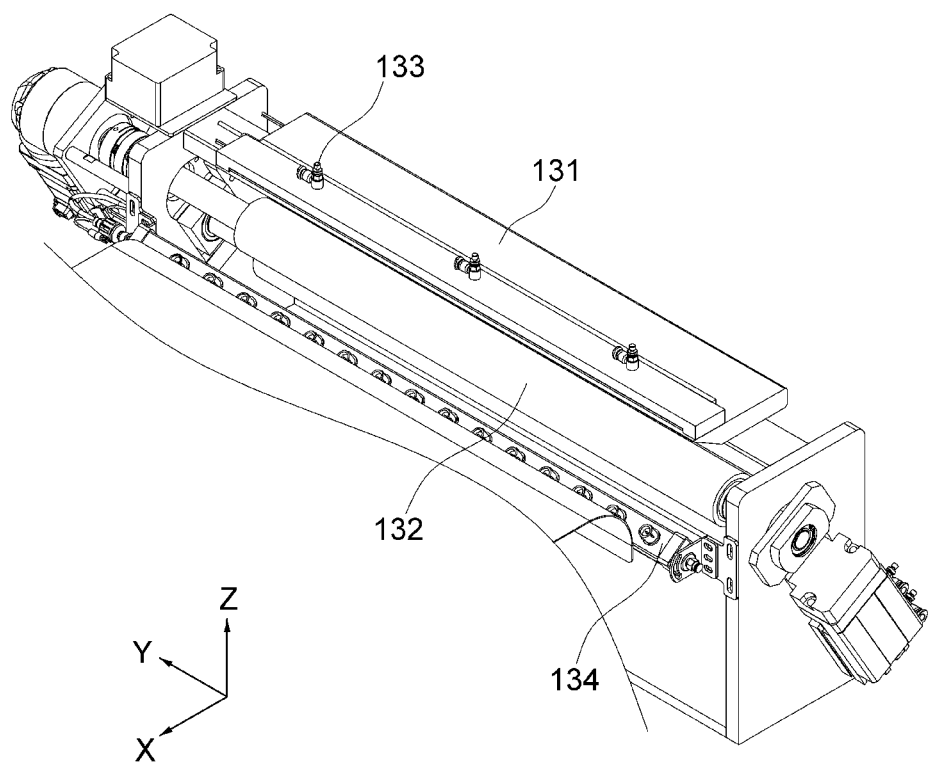
FIG. 7 is a perspective view illustrating a separation unit of the coverlay supply apparatus shown in FIG. 2.

According to an example, as shown in FIG. 7, the separation unit 130 may include a delamination plate part 131 and a release substrate guide roller part 132, and may further include an air blower 133 and/or an ionizer 134 as necessary.

The delamination plate part 131 is disposed adjacent to the cutting unit 120 to separate the coverlay 11 and the release substrate 12 from the coverlay film 10 when the coverlay film 10 is supplied from the cutting unit 120. The delamination plate part 131 may have a bent part formed at a predetermined angle or more in the moving direction (collecting direction) of the release substrate 12 of the coverlay film 10 so as to separate the coverlay 11 attached to one side of the release substrate 12 from the release substrate 12 of the coverlay film 10 and supply the same to the coverlay seating unit 310 of the pre-bonding apparatus 300. At this time, the release substrate 12 may be easily separated from the coverlay 11 by the force wound on the release substrate collecting roller part 116 of the coverlay film supply unit 110. Meanwhile, the coverlay 11 separated from the release substrate 12 by the delamination plate part 131 is supplied to the coverlay seating unit 310 of the pre-bonding apparatus 300 and seated thereon.

As shown in FIG. 7, the release substrate guide roller part 132 is a roller that is disposed below the delamination plate part 131 to be spaced apart therefrom and guides the release substrate 12 to be transferred from the coverlay film 10 supplied to the delamination plate part 131 to the release substrate collecting roller part 116.

The air blower 133 may be mounted on the delamination plate part 131 to remove foreign substances from the surface of the coverlay 11.

In addition, a first ionizer 134 is disposed below the delamination plate part 131 to be spaced apart therefrom and prevents the generation of static electricity in the coverlay 11 separated from the release substrate 12.

(2) Printed Circuit Board Supply Apparatus

As shown in FIGS. 1 and 2, the printed circuit board supply apparatus 200 is a device that automatically and continuously supplies the printed circuit board 20 into the pre-bonding apparatus 300.

Figure 8:
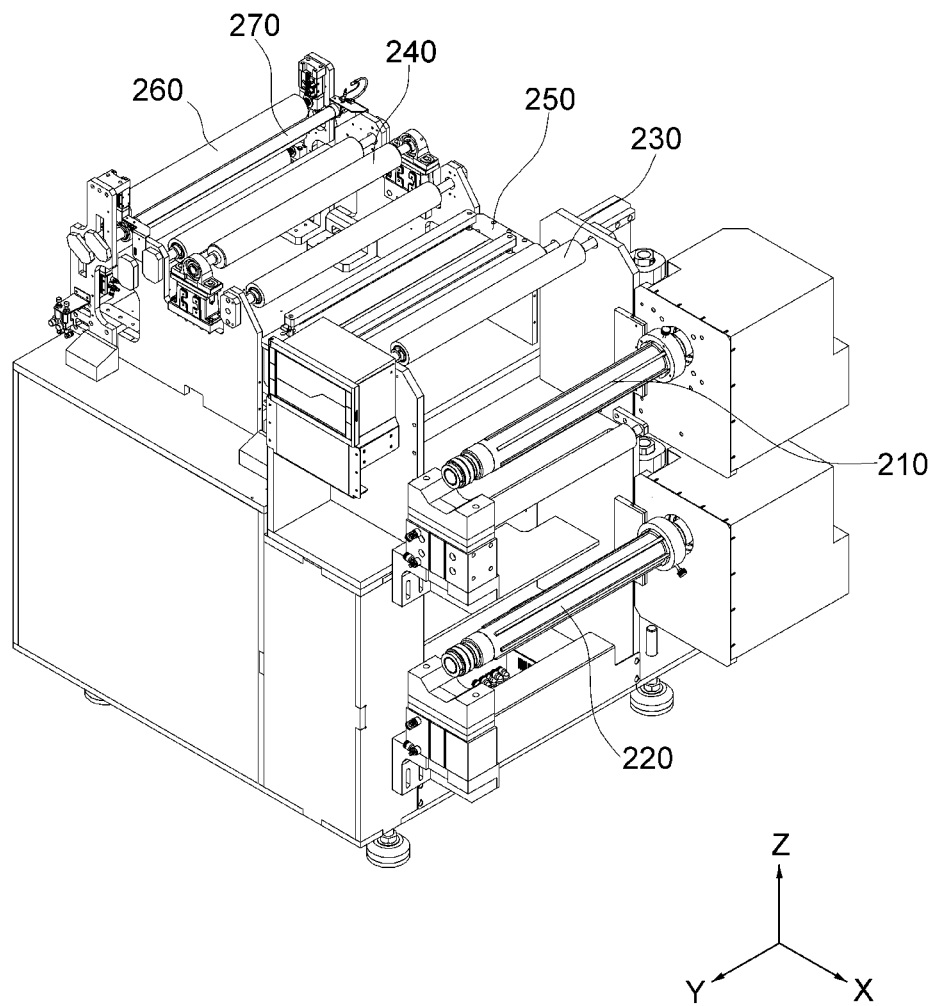
FIG. 8 is a perspective view illustrating the printed circuit board supply apparatus shown in FIG. 2.

According to an example, as shown in FIG. 8, the printed circuit board supply apparatus 200 may include a printed circuit board supply roller part 210, an inserted-paper collecting roller part 220, a second guide roller part 230, and a second tension adjustment roller part 240, and may further include at least one of a second splicing part 250, a second cleaning roller part 260, and a second ionizer part 270 as necessary.

The printed circuit board supply roller part 210 is a roller that supplies the printed circuit board 20 in one direction (e.g., the X-axis direction), and is an unwinder roller that continuously unwinds the printed circuit board 20 mounted in a roll form and supplies the same to the pre-bonding apparatus 300. Specifically, the printed circuit board supply roller part 210 is a roller that continuously unwinds the printed circuit board 20 and supplies the printed circuit board 20 to an aligning table unit 330 of the pre-bonding apparatus 300 to intersect the transfer direction of the coverlay 11 transferred to the aligning table unit 330 by a pickup transfer unit 320.

The inserted-paper collecting roller part 220 is a rewinder roller that collects an inserted paper (not shown) interposed between the printed circuit boards 20 wound around the printed circuit board supply roller part 210. According to an example, the inserted-paper collecting roller part 220 may be disposed at a position corresponding to the printed circuit board supply roller part 210 so as to be spaced apart therefrom. For example, as shown in FIG. 8, it may be disposed below the printed circuit board supply roller part 210 to be spaced apart from the printed circuit board supply roller part 210. The inserted paper is separated from the printed circuit board 20 supplied from the printed circuit board supply roller part 210 and wound around the inserted-paper collecting roller part 220 by the winding force of the inserted-paper collecting roller part 220, thereby being collected.

The second guide roller part 230 is a roller that guides the inserted paper separated from the printed circuit board 20 to the inserted-paper collecting roller part 220, while guiding the printed circuit board 20 supplied from the printed circuit board supply roller part 210 to the pre-bonding apparatus 300. The second guide roller part 230 may be disposed between the printed circuit board supply roller part 210 and the pre-bonding apparatus 300.

According to an example, a plurality of second guide roller parts 230 is disposed between the printed circuit board supply roller part 210 and the second splicing part 250 to separate the printed circuit board 20, supplied from the printed circuit board supply roller part 210, from the inserted paper and guide the same to the second splicing part 250, and guides the separated inserted paper to the inserted-paper collecting roller part 220.

The second tension adjustment roller part 240 is a guide roller capable of changing the vertical position thereof. Specifically, the second tension adjustment roller part 240 guides the printed circuit board 20 supplied from the printed circuit board supply roller part 210 to the pre-bonding apparatus 300 and changes in the vertical position of the roller according to the tension of the printed circuit board detected by a load cell. Accordingly, the tension of the printed circuit board 20 supplied from the printed circuit board supply roller part 210 may be constantly maintained. As described above, the second tension adjustment roller part 240 may guide the printed circuit board 20 supplied from the printed circuit board supply roller part 210 to the pre-bonding apparatus 300 at a constant speed.

The second splicing part 250 cuts the printed circuit board 20 supplied from the printed circuit board supply roller part 210 or splices the end of a new printed circuit board 20 to the end of an existing printed circuit board 20 when replacing the printed circuit board supply roller part 210. The second splicing part 250 is disposed adjacent to the printed circuit board supply roller part 210 that supplies the printed circuit board 20 to the same.

According to an example, although not specifically shown, the second splicing part 250 includes: a second plate member; a 2A-clamp member disposed on the second plate member in a direction (e.g., the Y-axis direction) intersecting the loading direction (e.g., the X-axis direction) of the printed circuit board 20; and a 2B-clamp member disposed on the second plate member to be spaced apart from the 2A-clamp member while facing the same. In this case, although not shown, the 2A- and 2B-clamp members may be opened and closed according to the hydraulic pressure applied to the hydraulic cylinder by a pressure control valve, but is not limited thereto.

The second cleaning roller part 260 is disposed between the printed circuit board supply roller part 210 and the pre-bonding apparatus 300, for example, between the second tension adjustment roller part 240 and the aligning table part 310 of the pre-bonding apparatus 300, to remove foreign substances from the surface of the printed circuit board 20 supplied from the printed circuit board supply roller part 210. The second cleaning roller part 260 may include a plurality of adhesive roller members in which adhesive material is applied to the roller surface so as to remove foreign substances by contact. The vertical position (height) of the second cleaning roller part 260 may be adjusted according to the hydraulic pressure applied to the hydraulic cylinder by a pressure control valve, but is not limited thereto.

In addition, the second ionizer 270 is disposed below the aforementioned second guide roller part 230 or second cleaning roller part 260 to be spaced apart therefrom to prevent the generation of static electricity in the printed circuit board 20.

(3) Pre-Bonding Apparatus

As shown in FIGS. 1 and 2, the pre-bonding apparatus 300 pre-bonds the coverlay 11 having a predetermined length automatically and continuously supplied from the coverlay supply apparatus 100 onto the printed circuit board 20 automatically and continuously supplied from the printed circuit board supply apparatus 200, thereby discharging a first composite board 30. Here, the first composite board 30 includes a printed circuit board 20 and a coverlay 11 pre-bonded onto the printed circuit board 20.

According to an example, as shown in FIGS. 9 to 16, the pre-bonding apparatus 300 may include a coverlay seating unit 310, a pickup transfer unit 320, an aligning table unit 330, and a pre-bonding unit 340, and may further include a first vision unit 350 and/or a second vision unit (not shown) as necessary.

1) Coverlay Seating Unit

Figure 9:
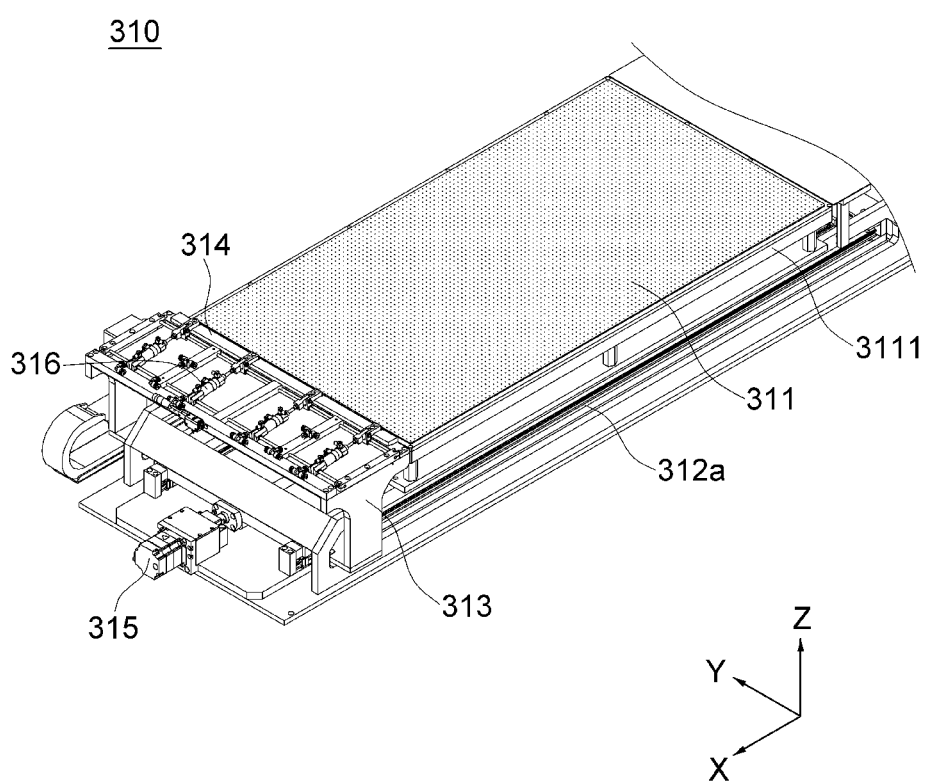
FIG. 9 is a perspective view illustrating a coverlay seating unit in the pre-bonding apparatus shown in FIG. 2.

The coverlay seating unit 310 is a part on which the coverlay 11 continuously supplied from the coverlay supply apparatus 100 is seated and waiting, and, as shown in FIG. 9, includes a seating table part 311, a pair of rail parts 312a and 312b, a transfer body part 313, a coverlay clamp part 314, and a transfer body driving part 315.

The seating table part 311 is disposed adjacent to the separation unit 130 of the coverlay supply apparatus 100 to suction-hold and release the coverlay 11 continuously supplied from the coverlay supply apparatus 100. That is, the seating table part 311 may suction-hold and release the coverlay 11 with a predetermined size, separated from the release substrate 12 and supplied from the separation unit 130 of the coverlay supply apparatus 100, by a vacuum (negative pressure).

According to an example, the seating table part 311 includes: a first plate member 3111; a plurality of first vacuum holes 3112 formed in the first plate member 3111; and a first vacuum generating member (not shown) connected to the first vacuum holes 3112 through a vacuum line (not shown) to generate a vacuum.

In the seating table part 311, a fluid may or may not flow into the plurality of first vacuum holes 3112 according to the first vacuum generating member (e.g., a vacuum ejector) applying and releasing vacuum pressure (negative pressure) through the vacuum line, so that the coverlay 11 may be attached onto or detached from the first plate member 3111. Accordingly, the coverlay 11 supplied from the separation unit 20 is seated on the first plate member 3111 of the seating table part 311 and waits before being transferred to the aligning table unit 330 by the pickup transfer unit 320.

Figure 10:
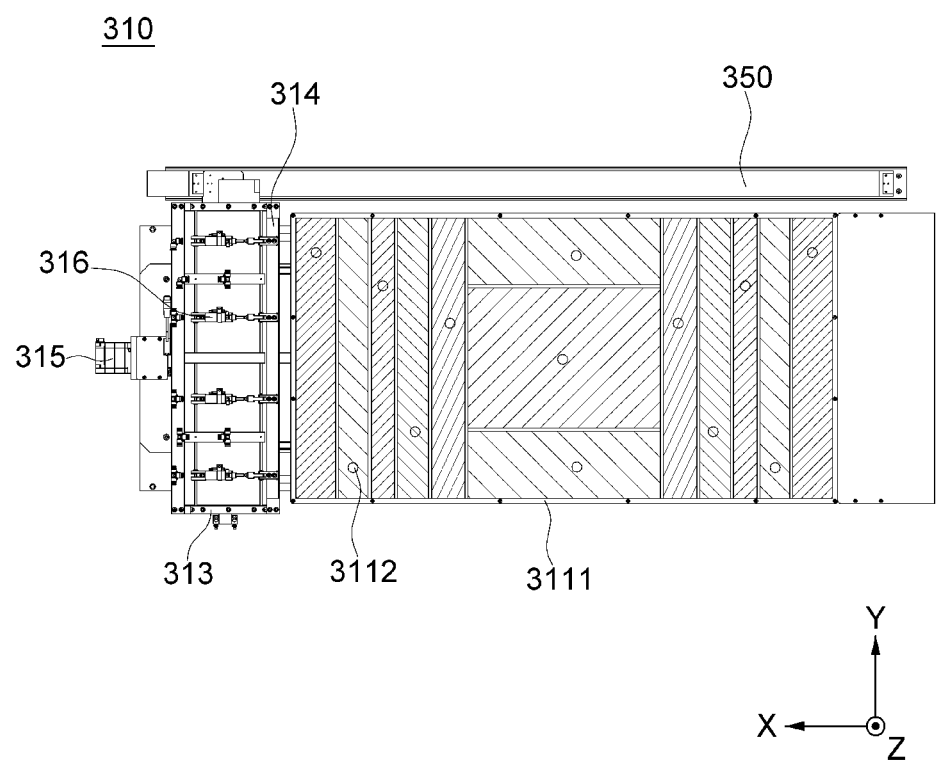
FIG. 10 is a plan view illustrating a plurality of vacuum regions of the seating table part shown in FIG. 9.

In addition, as shown in FIG. 10, the seating table part 311 is partitioned into a plurality of vacuum regions. As described above, since the vacuum regions of the seating table part 311 are individually separated, the vacuum suction sections may be configured depending on the size of the coverlay, thereby securing the suction stability of the coverlay.

As shown in FIG. 9, a pair of rail parts 312a and 312b is respectively installed on both sides of the aforementioned seating table part 311 in the longitudinal direction (the x-axis direction) of the seating table part 311, and the transfer body part 313 reciprocates above the seating table part 311 along the pair of rail parts 312a and 312b. At this time, the transfer body part 313 is driven by the transfer body driving part 315 (e.g., a server motor).

As shown in FIGS. 9 and 10, the coverlay clamp part 314 is disposed on the transfer body part 313 and clamps one end of the coverlay 11 supplied from the coverlay supply apparatus 100.

Specifically, the coverlay clamp part 314 is moved by the transfer body part 313 while clamping the coverlay 11 separated from the release substrate 12 by the separation unit 130 of the coverlay supply apparatus 100 to transfer the coverlay 11 onto the seating table part 311. As shown in FIGS. 9 and 10, the coverlay clamp part 314 is opened and closed according to the hydraulic pressure applied to the hydraulic cylinder 316 by a pressure control valve (not shown). At this time, the opening and closing speed of the coverlay clamp 314 may be adjusted by a speed control valve (not shown) in consideration of the supply speed of the coverlay 11 and the moving speed of the transfer body part 313.

2) Pickup Transfer Unit

In the pre-bonding apparatus 300 according to the present invention, the pickup transfer unit 320 is positioned to correspond to the position of the coverlay seating unit 310, picks up the coverlay 11 seated on the coverlay seating unit 310 and waiting, and transfers the same onto the printed circuit board 20 supplied from the printed circuit board supply apparatus 200.

Specifically, the pickup transfer unit 320 picks up the coverlay 11 waiting on the seating table part 311 of the coverlay seating unit 310 and transfers the picked-up coverlay 11 in a direction (e.g., the Y-axis direction) intersecting the loading direction (the X-axis direction) of the coverlay 11 supplied from the separation unit 130 of the coverlay supply apparatus 100. That is, the picked-up coverlay 11 is transferred onto the printed circuit board 20 that is temporarily mounted on an aligning table part 331 of the aligning table unit 330.

Figure 11:
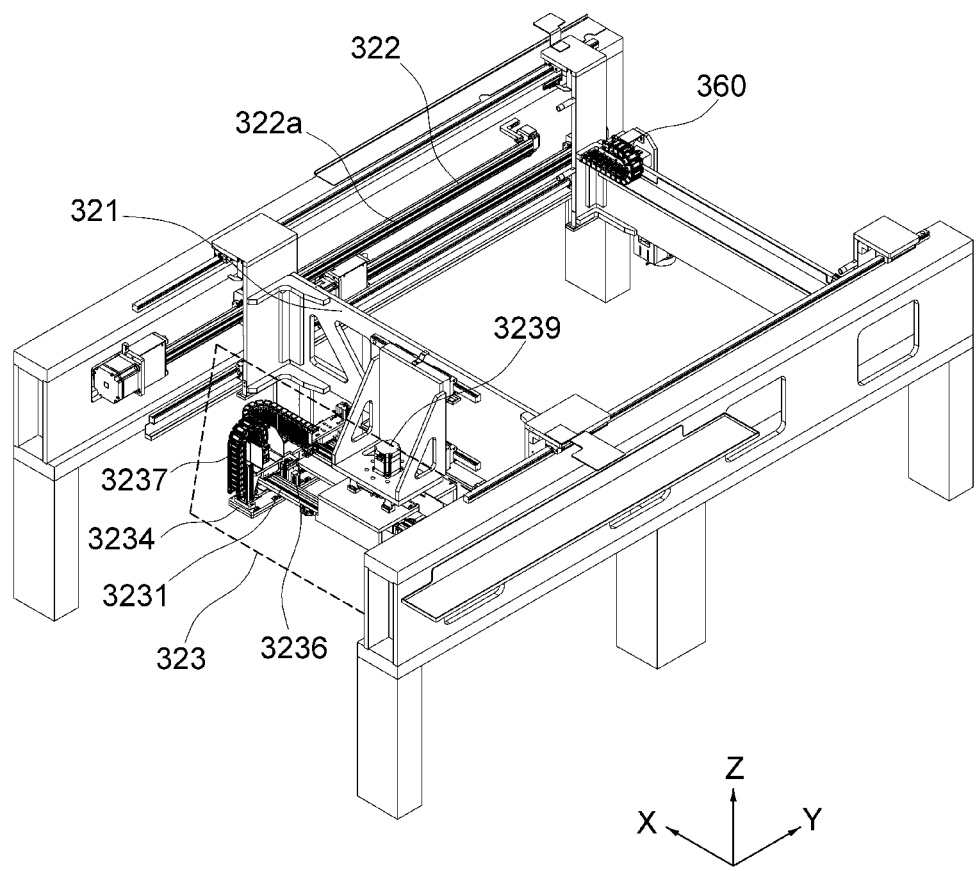
FIG. 11 is a perspective view illustrating a pickup transfer unit in the pre-bonding apparatus shown in FIG. 2.

According to an example, as shown in FIG. 11, the pickup transfer unit may include a pickup transfer body part 321, a transfer part 322, and a pickup part 323.

The pickup transfer body part 321 supports the pickup part 323 and reciprocates between the coverlay seating unit 310 and the aligning table unit 330 by the transfer part 322.

The transfer part 322 reciprocates the pickup transfer body part 321 in a direction (e.g., the Y-axis direction) intersecting the loading direction (e.g., the X-axis direction) of the coverlay 11.

Specifically, the transfer part 322 reciprocates the pickup transfer body part 321 between the seating table unit 310 and the aligning table unit 330. That is, the pickup transfer body part 321 is reciprocally moved from the seating table unit 310 to the aligning table unit 330 and from the aligning table unit 330 to the seating table unit 310 by the transfer part 322. Accordingly, the pickup part 323 supported by the pickup transfer body part 321 moves in a direction (e.g., the Y-axis direction) intersecting the loading direction (the X-axis direction) of the coverlay 11 as well. At this time, the coverlay 11 picked up by the pickup part 323 is transferred from the seating table part 311 of the seating table unit 310 onto the printed circuit board 20 that is stationed on the aligning table part 331. The transfer part 322 may include a driving member (not shown) (e.g., a servomotor) and a rail member 322a, and may be configured as another configuration capable of moving a mechanical apparatus straight in the art. In addition, the transfer part 322 may include a controller (not shown) capable of precisely controlling the transfer distance of the coverlay 11, that is, the moving distance from the pickup position of the coverlay 11 to the position at which the printed circuit board 20 is stationed. Such a controller may be configured to be built in a computer and controlled by software.

Figure 12:
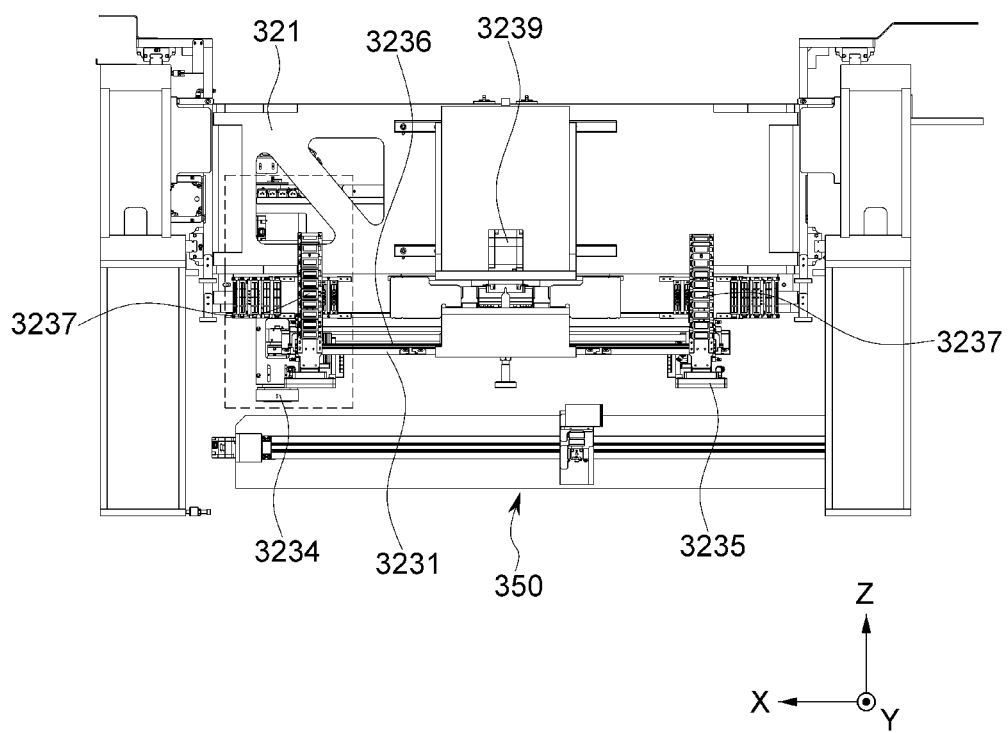
FIG. 12 is an enlarged front view of a pickup part of the pickup transfer unit shown in FIG. 11.
Figure 13:
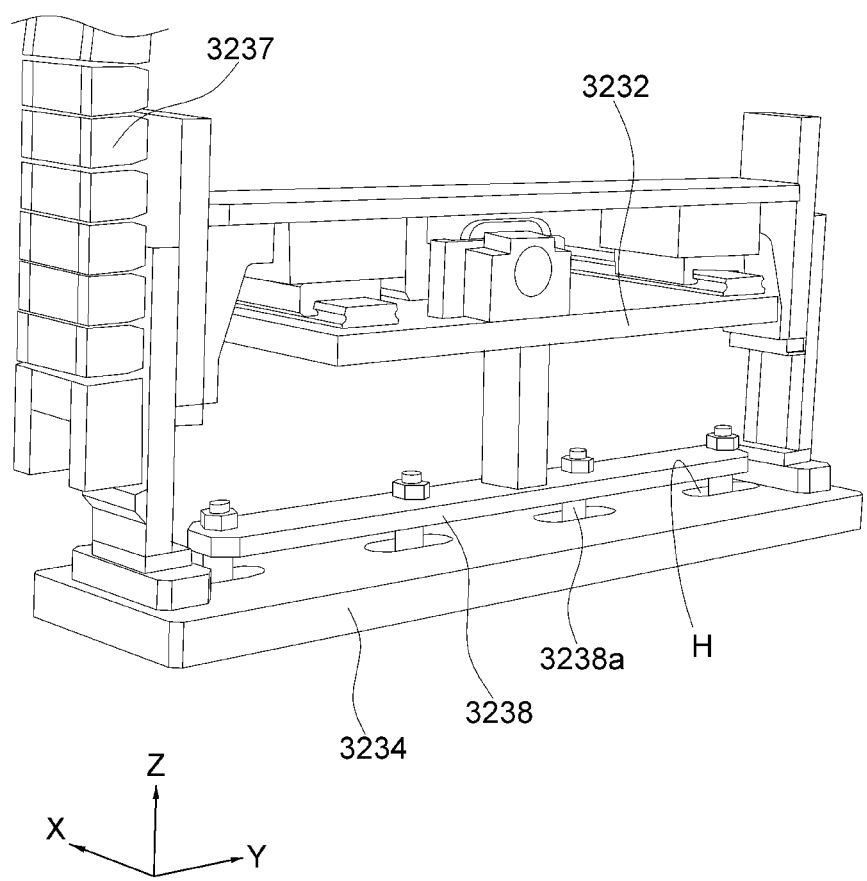
FIG. 13 is an enlarged perspective view of one side of the pickup part in the dotted line box shown in FIG. 12.

The pickup part 323 is supported by the pickup transfer body part 321 to pick up the coverlay 11 seated on the coverlay seating unit 310. As shown in FIGS. 12 and 13, the pickup part 323 may include a first support member 3231, a second support member 3232, a third support member 3233, a first pickup member 3234, a second pickup member 3235, a gap adjustment member 3236, and a transfer member 3237, and may further include a plurality of auxiliary pre-bond members 3238 and/or a rotational driving member 3239 as necessary.

The first support member 3231 is supported on the pickup transfer body part 321 by a bracket so as to support the second support member 3232 and the third support member 3233, and has a long shape in the X-axis direction. A rail of the gap adjustment member 3236 is disposed on the first support member 3231 in the longitudinal direction (the X-axis direction).

The second support member 3232 is a part to which the first pickup member 3234 is mounted, the third support member 3233 is a part to which the second pickup member 3235 is mounted, and the second and third support members 3232 and 3233 have a long shape in the Y-axis direction. The second support member 3232 and the third support member 3233 are movably disposed on the first support member 3231, and they are disposed to be spaced apart from each other. Accordingly, the first pickup member 3234 and the second pickup member 3235 mounted to the second support member 3232 and the third support member 3233, respectively, may pick up both sides of the coverlay 11 seated on the seating table part 311 to stably transfer the coverlay 11 to the aligning table unit 330. In this case, the separation distance between the second support member 3232 and the third support member 3233 may be adjusted by the gap adjustment member 3236 according to the size (length) of the coverlay in the longitudinal direction (the x-axis direction). Accordingly, the separation distance between the first pickup member 3234 and the second pickup member 3235 may be adjusted, thereby further improving pickup stability of the coverlay.

As shown in FIG. 13, the first pickup member 3234 is mounted to the second support member 3232, and the second pickup member 3235 is mounted to the third support member 3233. The first pickup member 3234 and the second pickup member 3235 may be a plate-shaped member including a plurality of suction pads or a vacuum suction plate having a plurality of vacuum suction holes formed therein.

According to an example, the first pickup member 3234 and the second pickup member 3235, which are vacuum suction plates, may include, for example, a plate that is long in the Y-axis direction and a plurality of vacuum holes formed in the plate. The first pickup member 3234 and the second pickup member 3235 may hold/release the coverlay 11 according to suction and release of air.

The gap adjustment member 3236 adjusts the separation distance between the second support member 3232 and the third support member 3233. That is, the gap adjustment member 3236 drives (moves) the second support member 3232 and the third support member 3233 in the X-axis direction, respectively, according to the mark position of the coverlay 11 photographed by the first vision unit 350, so that the first pickup member 3234 and the second pickup member 3235 are driven (moved) in the X-axis direction. The gap adjustment member 3236 may include a driving member (not shown) (e.g., a servomotor) and a rail member 3236a, and may be configured as another configuration capable of moving a mechanical apparatus straight in the art. In addition, the gap adjustment member 3236 may include a controller (not shown) capable of controlling the separation distance between the second support member 3232 and the third support member 3233 depending on the size of the coverlay 11. Such a controller may be configured to be built in a computer so to be controlled by software.

The transfer member 3237 moves the first pickup member 3234 and the second pickup member 3235 up and down. The transfer member 3237 may include a hydraulic cylinder and a pressure control valve for regulating the pressure of the cylinder. Accordingly, the first pickup member 3234 and the second pickup member 3235 reciprocate in the Z-axis direction according to the hydraulic pressure applied to the hydraulic cylinder by the pressure control valve. Specifically, the first pickup member 3234 and the second pickup member 3235 descend to the coverlay 11 waiting on the seating table part 311 by the transfer member 3237 to suck up the coverlay 11 and then ascend. Thereafter, when the pickup part 323 is transferred to the aligning table part 331, the first pickup member 3234 and the second pickup member 3235 descend to the printed circuit board 20 stationed (supported) on the aligning table part 331 by the transfer member 3237, release the coverlay 11, and then ascend. After that, the pickup part 323 is transferred back to the seating table part 311. By repeating the above process, the coverlay 11 is picked up from the seating table part 311 and transferred onto the printed circuit board 12 on the aligning table part 331.

In addition, the pickup part 323 may further include an auxiliary pre-bond member 3238 mounted to at least one of the second support member 3232 and the third support member 3233 as shown in FIG. 13. For example, the auxiliary pre-bond member 3238 may be mounted to the second support member 3232 and the third support member 3233, respectively. When the coverlay 11 picked up by the pickup members 3234 and 3235 is transferred onto the printed circuit board 20, the auxiliary pre-bond member 3238 may pre-bond the transferred coverlay 11 to the printed circuit board 20 by hot-pressing the same. That is, the coverlay 11 and the printed circuit board 20 are point-pre-bonded by the auxiliary pre-bond member 3238. At this time, the coverlay 11 may be more easily detached from the pickup members 3234 and 3235 by pressurizing of the auxiliary pre-bond member 3238.

According to an example, the first and second auxiliary pre-bond members 3238 are mounted to the second support member 3232 and the third support member 3233, respectively. Each auxiliary pre-bond member 3238 is a plate member equipped with a plurality of heater rods 3238a mounted thereto, and is driven up and down. In this case, the first and second auxiliary pre-bond members 3238 are respectively mounted to the second support member 3232 and the third support member 3233 above the first and second pickup members 3234 and 3235 so as to be spaced apart from the first and second pickup members 3234 and 3235. At this time, a plurality of through-holes H is formed in each of the first and second pickup members 3234 and 3235, and the heater rods 2338a of the auxiliary pre-bond member 3238 are mounted to the positions corresponding to the positions of the through-holes. Therefore, according to ascending and descending of the auxiliary pre-bond member 3238, the heater rod may pass through the through-hole H to point-pre-bond the coverlay 11 to the printed circuit board 20.

Like the above-described first pickup member 3234 and second pickup member 3235, the auxiliary pre-bond member 3238 ascends and descends in the Z-axis direction by a second transfer member (not shown) including a hydraulic cylinder and a pressure control valve for regulating the pressure of the cylinder. At this time, the auxiliary pre-bond member 3238 moves up and down together with the first pickup member 3234 and the second pickup member 3235 at the same time. However, the vertical movement distance of the auxiliary pre-bond member 3238 is preferably equal to or greater than the vertical movement distance of the first pickup member 3234 and the second pickup member 3235 so as to move further down than the first pickup member 3234 and the second pickup member 3235.

In addition, the pickup part 323 may further include a rotational driving member 3239 for rotating the first support member 3231 in a direction (Z direction) perpendicular to the printed circuit board 20 as shown in FIG. 12. When the mark position of the coverlay 11 picked up by the first and second pickup members 3234 and 3235 is rotated by a predetermined angle from a predetermined reference position, the rotational driving member 3239 rotates the first support member 3231 around the vertical direction (Z direction) of the printed circuit board 20 to return the coverlay 11 to the reference position. Accordingly, an alignment error between the picked-up coverlay 11 and the printed circuit board 20 may be corrected both in the X-axis direction and in the Y-axis direction. An example of the rotational driving member 3239 may be a servomotor.

3) Aligning Table Unit

In the pre-bonding apparatus 300 according to the present invention, the aligning table unit 330 aligns the coverlay 11 transferred by the pickup transfer unit 320 onto the printed circuit board 20 that is automatically and continuously supplied from the printed circuit board supply apparatus 200. At this time, the transfer direction of the coverlay 11 and the loading direction of the printed circuit board 20 may cross each other. For example, if the transfer direction of the coverlay 11 transferred by the pickup transfer unit 320 is one direction (e.g., the Y-axis direction), the loading direction of the printed circuit board 20 supplied from the printed circuit board supply apparatus 200 may be a direction (e.g., the X-axis direction) intersecting the first direction. The aligning table unit 330 may automatically and continuously discharge a 1A-composite board 30a in which the transferred coverlay 11 is stacked on each unit portion of the printed circuit board 20.

As shown in FIG. 2, the aligning table unit 330 is disposed adjacent to the seating table part 311 of the coverlay seating unit 310. Specifically, the aligning table unit 330 is disposed in a direction intersecting the loading direction (e.g., the X-axis direction) of the coverlay 11 supplied from the separation unit 130 to the coverlay seating unit 310 of the pre-bonding apparatus 300, for example, in the Y-axis direction, and is disposed at the point intersecting the loading direction (e.g., the X-axis direction) of the printed circuit board 20 supplied from the printed circuit board supply apparatus 200.

Figure 14:
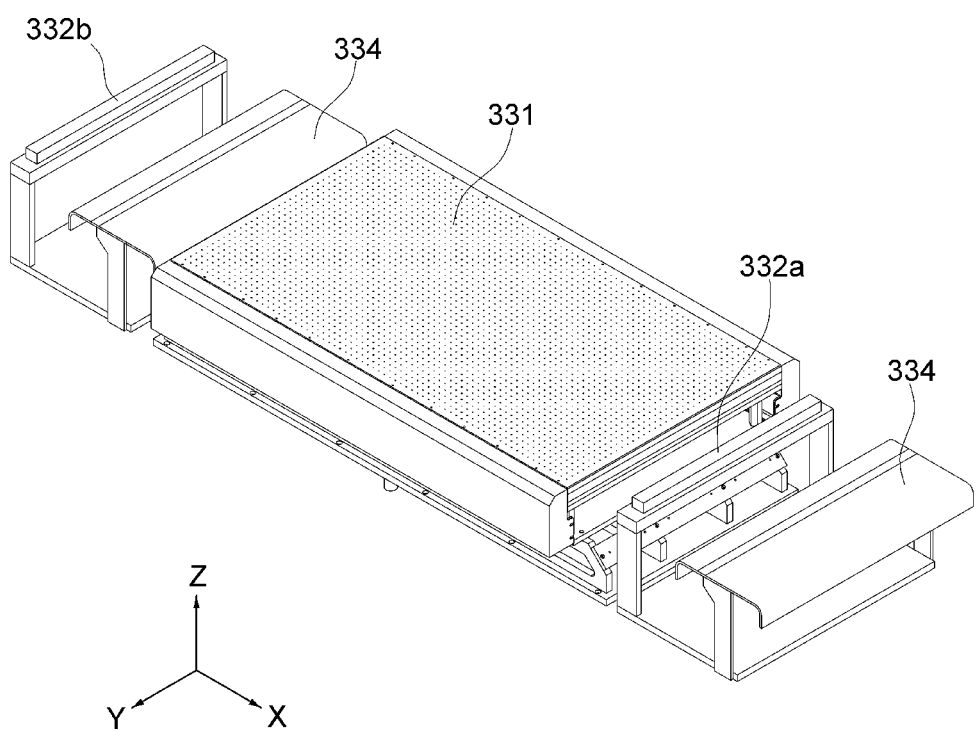
FIG. 14 is a perspective view illustrating an aligning table unit in the pre-bonding apparatus shown in FIG. 2.
Figure 15:
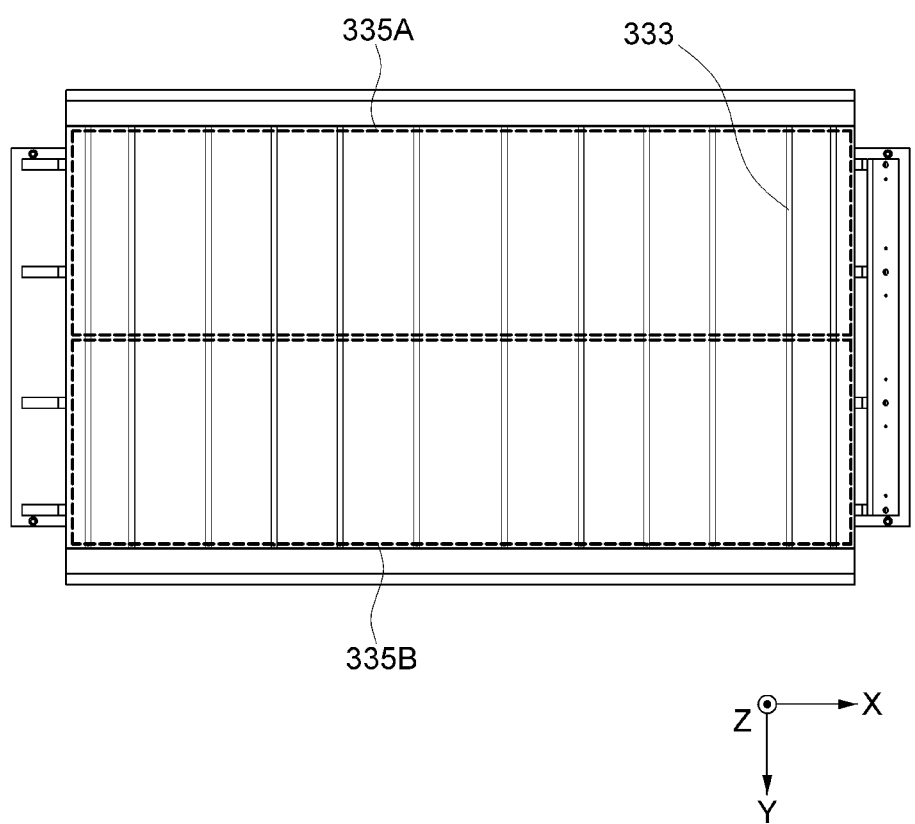
FIG. 15 is a plan view illustrating the aligning table unit shown in FIG. 14.

According to an example, the aligning table unit 330, as shown in FIGS. 14 and 15, may include an aligning table part 331, and first and second printed circuit board clamp parts 332a and 332b, and may further include an auxiliary pre-bonding part 333, an auxiliary pre-bond transfer part (not shown), and an auxiliary aligning table part 334 as necessary.

In the aligning table part 331, the printed circuit board 20 supplied from the printed circuit board supply apparatus 100 is temporarily stationed (supported), and the coverlay 11 transferred over the printed circuit board 20 is seated and aligned. Specifically, as shown in FIG. 14, the aligning table part 331 suction-holds and releases a portion of the printed circuit board 20 on which the coverlay 11 is disposed (hereinafter referred to as a "unit portion of the printed circuit board) by a vacuum (negative pressure) when the coverlay 11 and the printed circuit board 20 are aligned, thereby temporarily seating the printed circuit board 20. At this time, the coverlay 11 transferred by the pickup transfer unit 320 is aligned onto the seated printed circuit board 20.

According to an example, although not shown in the drawing, the aligning table part 331 may include: a second plate member; a plurality of second vacuum holes formed in the second plate member; and a second vacuum generation member that is connected to the second vacuum hole through a vacuum line to generate a vacuum.

Like the seating table part 311 described above, in the aligning table part 331, as the second vacuum generation member (e.g., a vacuum ejector) applies or releases vacuum pressure (negative pressure) through the vacuum line, a fluid flows or does not flow into the plurality of second vacuum holes. Accordingly, the unit portion 2' of the printed circuit board 20 continuously supplied from the printed circuit board supply apparatus 200 may be attached to or detached from the second plate member. As described above, the coverlay 11 that is picked up and transferred by the pickup transfer part 320 is aligned onto the unit portion 2' of the printed circuit board 20 seated on the aligning table part 331.

In addition, as shown in FIG. 15, the aligning table part 331 is divided into a plurality of vacuum regions. As described above, since the vacuum regions of the aligning table part 331 are individually separated, a vacuum suction section may be configured according to the size of each unit portion of the printed circuit board on which the coverlay 11 is disposed, thereby reducing an error in the alignment between the coverlay and the printed circuit board.

As shown in FIG. 14, the first printed circuit board clamp part 332a is disposed to be spaced apart from one end of the aligning table part 311 in the width direction of the aligning table part 311, that is, in a direction (e.g., the X-axis direction) intersecting the loading direction of the printed circuit board, and the second printed circuit board clamp part 332b is disposed to be spaced apart from the opposite end of the aligning table part 311 while facing the first printed circuit board clamp part 332a. Accordingly, in order to align the coverlay 11 to the unit portion 2' of the printed circuit board 20 continuously supplied from the printed circuit board supply apparatus 200, the first and second printed circuit board clamp parts 332a and 332b may clamp both portions of the printed circuit board, which are spaced apart from the printed circuit board portion 2' on which the coverlay is disposed.

As shown in FIG. 14, the first and second printed circuit board clamp parts 332a and 332b are opened and closed according to the pressure applied to a first cylinder (not shown). In addition, the first and second printed circuit board clamp parts 332a and 332b themselves may ascend and descend by a second cylinder (not shown) depending on the loading height of the supplied printed circuit board 20.

The aligning table unit 330 may further include an auxiliary pre-bonding part 333 as necessary. As shown in FIG.

15, the auxiliary pre-bonding part 333 may be installed above the aligning table part 331 so as to move up and down, and pre-bond a portion of the coverlay 11 transferred by the pickup transfer unit 320 to the unit portion 2' of the printed circuit board 20 stationed on the aligning table part 331. According to an example, the auxiliary pre-bonding part 333 may include a plurality of heater rods installed along the X-axis and/or the Y-axis and connected to each other.

The auxiliary pre-bonding part 333 moves up and down by an auxiliary pre-bond transfer part (not shown). That is, the auxiliary pre-bonding part 333 is located above the aligning table part 331 before the coverlay 11 is transferred by the pickup transfer unit 320, and, when the coverlay is aligned with the unit portion 2' of the printed circuit board 20 on the aligning table part 331 by the pickup transfer unit 320, descends to the aligned coverlay 11 to pre-bond the coverlay 11 to the unit portion 2' of the printed circuit board 20.

The aligning table unit 330 may further include an auxiliary aligning table part 334 as necessary. The auxiliary aligning table part 334 is disposed at least one of the position between the first printed circuit board clamp part 332a and the aligning table part 331 and the position between the second printed circuit board clamp part 332b and the aligning table part 331. The auxiliary aligning table part 334 prevents the printed circuit board from sagging when aligning the coverlay 11 with the printed circuit board, and assists the first and second printed circuit board clamp parts 332a and 332b to stably clamp the printed circuit board.

4) First Vision Unit

In the pre-bonding apparatus 300 according to the present invention, the first vision unit 350 is disposed between the seating table part 311 of the coverlay seating unit 310 and the aligning table part 331 of the aligning table unit 330 so as to be adjacent to the coverlay seating unit 310, and photographs the pickup position of the coverlay picked up by the pickup transfer unit 320 to generate a first signal for aligning the position of the coverlay.

Specifically, the first vision unit 350 is disposed adjacent to the coverlay seating unit 310 between the seating table part 311 of the seating unit 310 and the aligning table part 331 of the aligning table unit 330 in order to photograph the bottom surface of the coverlay 11 picked up by the pickup transfer unit 320. For example, as shown in FIGS. 10 and 12, the first vision unit 350 is disposed under the pickup transfer unit 320 in a direction (the X-axis direction) intersecting the transfer direction (e.g., the Y-axis direction) of the coverlay 11 transferred by the pickup transfer unit 320 so as to be adjacent to the seating table part 311 of the coverlay seating unit 310.

The first vision unit 350 photographs the bottom surface of the coverlay picked up by the pickup transfer unit 320, recognizes a pickup (mark) position of the coverlay with respect to the bottom surface of the pickup transfer unit 320 through image analysis, checks a difference thereof from a predetermined position value, and generates a first signal for aligning the position where the coverlay is to be pre-bonded. An offset value may be applied to the pickup transfer unit 320 according to the first signal, so that the first support member 3231 of the pickup part 323 in the pickup transfer unit 320 may be aligned by rotating or moving the same left, right, up, and down. Accordingly, the precision of the pre-bond position between the coverlay 11 and the printed circuit board 20 may be further improved. In particular, when the mark position of the coverlay 11 picked up by the pickup transfer unit 320 is rotated by a predetermined angle from a reference position, the rotation angle of the coverlay 11 is checked by the first vision unit 350, and a signal according to the result is transmitted to the rotational driving member 3236 capable of rotating the first support member 3231 of the pickup transfer unit 320 around the vertical direction (the Z direction) of the printed circuit board 20, thereby rotating the first support member 3231 to return to the reference position.

5) Second Vision Unit

In the pre-bonding apparatus 300 according to the present invention, although it is not shown, the second vision unit is positioned to face the aligning table unit 330, and photographs the stationed (seating) position of the printed circuit board supplied to the aligning table unit to generate a second signal for aligning the position where the coverlay transferred by the pickup transfer unit is pre-bonded.

Specifically, the second vision unit photographs the top surface of the printed circuit board 20 that is stationed (seated) on the aligning table part 331 of the aligning table unit 330, recognizes a mark position of the printed circuit board through image analysis, checks a difference thereof from the mark position of the coverlay 11 picked up by the pickup transfer unit 320, and generates a second signal for aligning the position where the coverlay 11 is pre-bonded. When an offset value is applied to the pickup transfer unit 320 according to the second signal, the transfer distance of the pickup transfer body part 321 or the vertical or horizontal movement distance and rotation angle of the first support member 3231 may be adjusted, thereby further improving the precision of the pre-bond position.

6) Pre-Bonding Unit

In the pre-bonding apparatus 300 according to the present invention, the pre-bonding unit 340 pre-bonds the coverlay 11 and the printed circuit board 20, which are aligned in the aligning table unit 330. That is, the pre-bonding unit 340 pre-bonds the coverlay 11 and each unit portion 2' of the printed circuit board of the 1A-composite board 30a automatically and continuously supplied from the aligning table unit 330. Accordingly, it is possible to automatically and continuously obtain a first composite board 30 in which the coverlay 11 is pre-bonded to each unit portion of the printed circuit board 20.

As shown in FIG. 2, the pre-bonding unit 340 is disposed adjacent to the aligning table unit 330 in a straight line along the loading direction (the Y-axis direction) of the printed circuit board.

Figure 16:
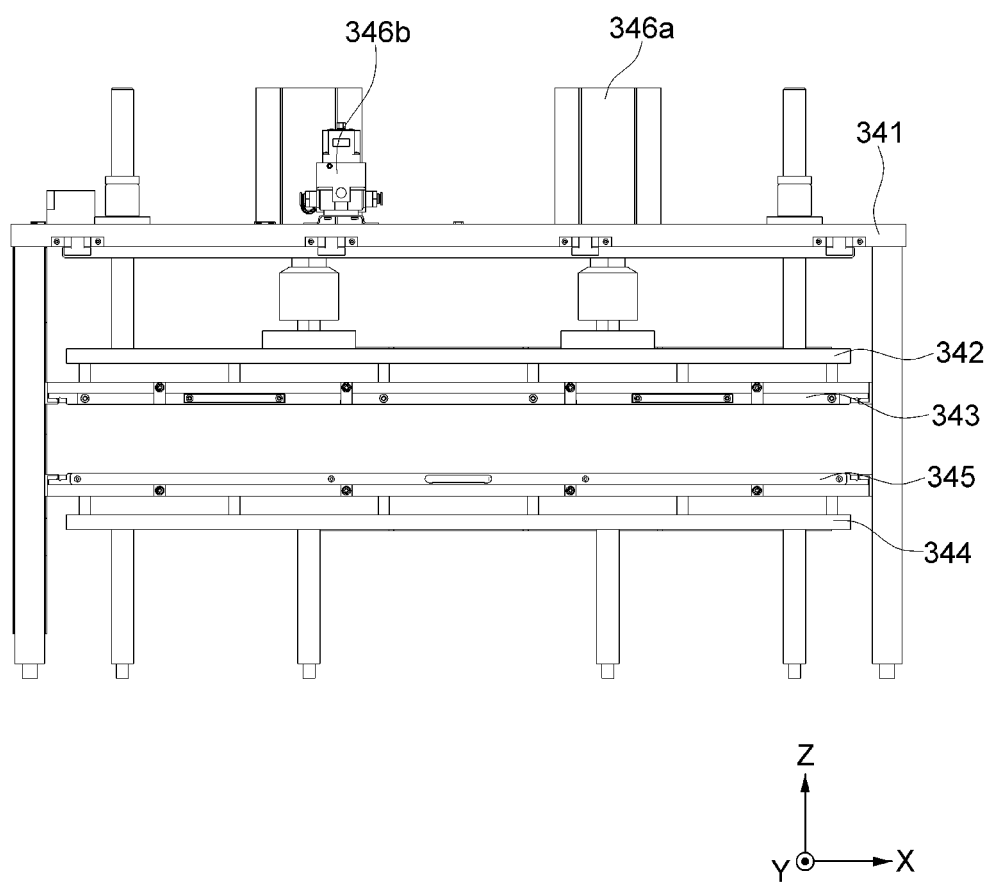
FIG. 16 is a perspective view illustrating a pre-bonding unit in the pre-bonding apparatus shown in FIG. 2.

According to an example, the pre-bonding unit 340, as shown in FIG. 16, may include a pre-bonding housing part 341, an upper support part 342, an upper pre-bonding part 343, a lower support part 344, a lower pre-bonding part 345, and a driving part 346, and may further include first and second pre-bond clamp parts (not shown) as necessary.

The upper support part 342 is disposed inside the pre-bonding housing part 341 to support the upper pre-bonding part 343. As the upper support part 342 is driven up and down by the driving part 346, the upper pre-bonding part 343 is also driven up and down. Accordingly, the upper pre-bonding part 343 hot-presses the coverlay 11 and the printed circuit board 20, which are input and stationed between the upper pre-bonding part 343 and the lower pre-bonding part 345 from the aligning table unit 330, together with the lower pre-bonding part 345.

The upper pre-bonding part 343 is mounted under the upper support part 342, and moves up and down together the upper support part 342 according to the vertical movement thereof. The upper pre-bonding part 343 hot-presses entire surfaces of the coverlay 11 and the front surface of the printed circuit board 20, which are stationed between the upper pre-bonding part 343 and the lower pre-bonding part 346, from above when descending, thereby obtaining a first composite board 30 on which the coverlay 11 and the printed circuit board 20 are surface-pre-bonded.

The upper pre-bonding part 343 may include a plate member and, if necessary, include a cushion member and/or a release member disposed on the bottom surface of the plate member. The upper pre-bonding part 343 may be detached from the upper support part 342, and accordingly, the upper pre-bonding part 343 may be removed from the pre-bonding housing part 341 to the outside, so a damaged plate member or cushion member may be easily replaced.

The lower support part 344 is disposed to face the upper support part 342 inside the pre-bonding housing part 341 so as to support the lower support part 344.

The lower pre-bonding part 345 is above the lower support part 344. That is, the lower pre-bonding part 345 is disposed to face the upper pre-bonding part 343. Therefore, like the upper pre-bonding part 343, the lower pre-bonding part 345 hot-presses the entire surface of the coverlay 11 and the printed circuit board 20, which are stationed between the upper pre-bonding part 343 and the lower pre-bonding part 346, from the bottom when the lower pre-bonding part 343 descends, thereby form a first composite board 30.

The lower pre-bonding part 345, like the upper pre-bonding part 343, may include a plate member, and may include a cushion member and/or a release member disposed on the bottom surface of the plate member as necessary. In addition, the lower pre-bonding part 345 may also be detached from the lower support part 344. Accordingly, since the lower pre-bonding part 344 may be removed from the pre-bonding housing part 341 to the outside, a damaged plate member or cushion member may be easily replaced.

The driving part 346 drives the upper support part 342 up and down. The driving part 346 includes a hydraulic cylinder 346a and a pressure control valve 346b for regulating the pressure of the hydraulic cylinder. Accordingly, the upper support part 342 ascends and descends according to the hydraulic pressure applied to the hydraulic cylinder 346a by the pressure control valve 346b.

Although not shown, the first pre-bond clamp part is disposed to be spaced apart from one end of the pre-bonding housing part 341 in the width direction of the pre-bonding housing part 341, that is, in a direction (e.g., the Y-axis direction) intersecting the loading direction of the printed circuit board on which the coverlay is aligned, and the second pre-bond clamp part is disposed to be spaced apart from the opposite end of the pre-bonding housing part 341 while facing the first pre-bond clamp part. Therefore, the first and second pre-bond clamp parts may respectively clamp both portions of the 1A-composite board 30a, which are spaced apart from the unit portion of the printed circuit board 20, such that the 1A-composite board 30a continuously and automatically supplied from the aligning table unit 330 may be surface-pre-bonded by the upper pre-bonding part 343 and the lower pre-bonding part 345.

These first and second pre-bond clamp parts are opened and closed according to the pressure applied to a third cylinder (not shown). In addition, the first and second pre-bond clamp parts themselves may be moved up and down by a fourth cylinder (not shown) depending on the loading height of the supplied 1A-composite board 30a, thereby adjusting positions of the first and second pre-bond clamp parts.

Hot-pressing conditions in the pre-bonding unit 340 described above are not particularly limited, and may be, for example, a temperature of about 50 to 100° C. and about 1 to 3 kgf/cm². In this case, it is possible to remove a void from the interface between the coverlay 11 and the printed circuit board 20 during the pre-bonding of the 1A-composite board 30a. The above hot-pressing conditions, the above-described hydraulic pressure of the driving part 346, and opening/closing and position adjustment of the first and second pre-bond clamp parts may be controlled by a controller (not shown). The controller (not shown) may be configured to be built in a computer and controlled by software.

(4) Transfer Apparatus

As shown in FIGS. 1 and 2, the transfer apparatus 400 is disposed between the pre-bonding apparatus 300 and the hot-press apparatus 500 and automatically and continuously transfers, to the hot-press apparatus 500, the first composite board 30 in which the coverlay 11 and the printed circuit board 20 are pre-bonded by the pre-bonding apparatus 300. At this time, the transfer apparatus 400 supplies the first composite board 30 into the hot-press apparatus 500 while controlling the supply amount of the first composite board 30.

Figure 17:
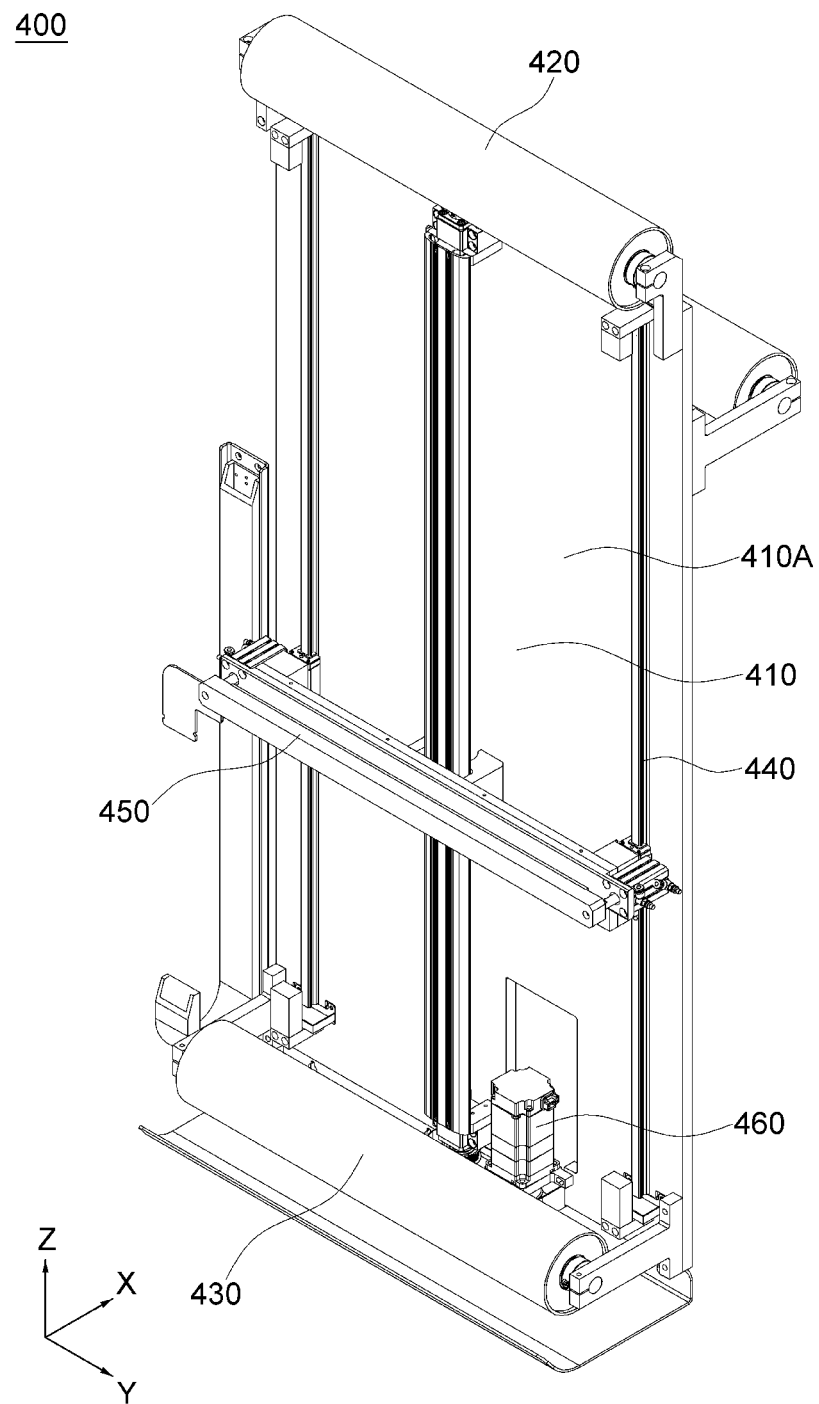
FIG. 17 is a perspective view illustrating the transfer apparatus shown in FIG. 2.

According to an example, the transfer apparatus 400, as shown in FIG. 17, includes a transfer body part 410, a first transfer guide roller part 420, a second transfer guide roller part 430, rail parts 440, a transfer clamp part 450, and a clamp driving part 460.

The transfer body part 410 supports the transfer guide roller part 420, the second transfer guide roller part 430, the transfer clamp part 450, and the clamp driving part 460.

The first transfer guide roller part 420 is a roller that is installed at one end (e.g., the upper end) of the transfer body part 410 and guides the first composite board 30 supplied from the pre-bonding apparatus 300 to the opposite end (e.g., the lower end) of the transfer body part 410.

The second transfer guide roller part 430 is installed at the opposite end (e.g., the lower end) of the transfer body part 410 and guides the first composite board 30 automatically and continuously supplied from the first transfer guide roller part 420 to the hot-press apparatus 500, specifically, to a film guide roller part 513 of a protection film supply unit 510. To this end, the second transfer guide roller part 430 is further spaced apart from the transfer body part 410 than the first transfer guide roller part 420.

The rail parts 440 are installed on one surface 410A of the transfer body part 410 in the longitudinal direction of the transfer body part 410.

The transfer clamp part 450 moves along the rail parts 440 and is positioned between the first transfer guide roller part 420 and the second transfer guide roller part 430 to clamp the first composite board 30 supplied from the first transfer guide roller part 420. The transfer clamp part 450 moves up and down along the rail part 440 while clamping the first composite board 30 to transfer the first composite board to the second transfer guide roller part 430 while controlling the supply amount of the first composite board 30.

Specifically, the hot-pressing time of the first composite board 30 in the hot-press apparatus 500 is greater than the pre-bonding time of the coverlay 11 and the printed circuit board 20 in the pre-bonding unit 340 of the pre-bonding apparatus 300. Therefore, in the present invention, the supply speed of the first composite board 30 from the pre-bonding apparatus 300 to the hot-press apparatus 500 is adjusted by the vertical movement of the transfer clamp part 450 of the transfer apparatus 400 disposed between the pre-bonding apparatus 300 and the hot-press apparatus 500, thereby controlling the supply amount of the first composite board 30.

That is, when the hot-pressing process is initiated in the hot-press apparatus 500, the transfer clamp part 450 of the transfer apparatus 400 stops at a position adjacent to the first transfer guide roller part 420 in the state of clamping the first composite board 30 that is discharged at a constant speed from the pre-bonding unit 340 of the pre-bonding apparatus 300. At this time, the first composite board 30 discharged at a constant speed from the pre-bonding unit 340 of the pre-bonding apparatus 300 is clamped by the transfer clamp part 450 to be stagnant, instead of being supplied into the hot-press apparatus 500. Afterwards, when the hot-pressing process is completed in the hot-press apparatus 500, the transfer clamp part 450 is driven downwards to a configured height along the rail parts 440 by the clamp driving part 460 in the state of clamping the stagnant first composite board 30. At this time, the configured height is adjusted depending on the stalled length of the first composite board 30 that is stalled by the transfer clamp part 450, and the stalled length of the first composite board 30 is proportional to the time difference between the pre-bonding process and the hot-pressing process. However, the first composite board 30, which is transferred downwards while being clamped by the transfer clamp part 450, is automatically and continuously supplied into the hot-press apparatus 500 faster by a configured driving speed of the transfer clamp part 440 than the discharge speed of the first composite board 30 discharged from the pre-bonding apparatus 300. Thereafter, when the hot-pressing process is performed on the first composite board 30 supplied into the hot-press apparatus 500, the transfer clamp part 450 is driven upwards to a configured height along the rail parts 440 by the clamp driving part 460 after unclamping the first composite board 30, and clamps again the first composite board 30 discharged at a constant speed from the pre-bonding unit 340 and then stops. As described above, the loading speed of the first composite board 30 supplied from the pre-bonding apparatus 300 to the hot-press apparatus 500 is adjusted according to the vertical driving of the transfer clamp part 450 of the transfer apparatus 400, thereby adjusting the supply amount of the first composite board.

The clamp driving part 460 is mounted to the transfer body part 410 and includes a cylinder and a servomotor to open and close the aforementioned transfer clamp part 450, as well as moving the transfer clamp part 450 vertically.

The clamp driving part 460 may be controlled by a clamp driving controller (not shown). The clamp driving controller (not shown) controls the clamp driving part 460 such that the supply amount of the first composite board 30 supplied to the hot-press apparatus 500 is delayed depending on the time difference between the pre-bonding time of the pre-bonding apparatus and the hot-pressing time of the hot-press apparatus, and the loading speed of the first composite board 30. Accordingly, the clamp driving part 460 drives the transfer clamp part 450 up and down to a configured height, and, at this time, adjusts the driving speed and the driving distance when driving the transfer clamp part 450 down.

(5) Hot-Press Apparatus

As shown in FIGS. 1 and 2, the hot-press apparatus 500 hot-presses the first composite board 30 transferred from the pre-bonding apparatus 300 by the transfer apparatus 400.

Figure 18:
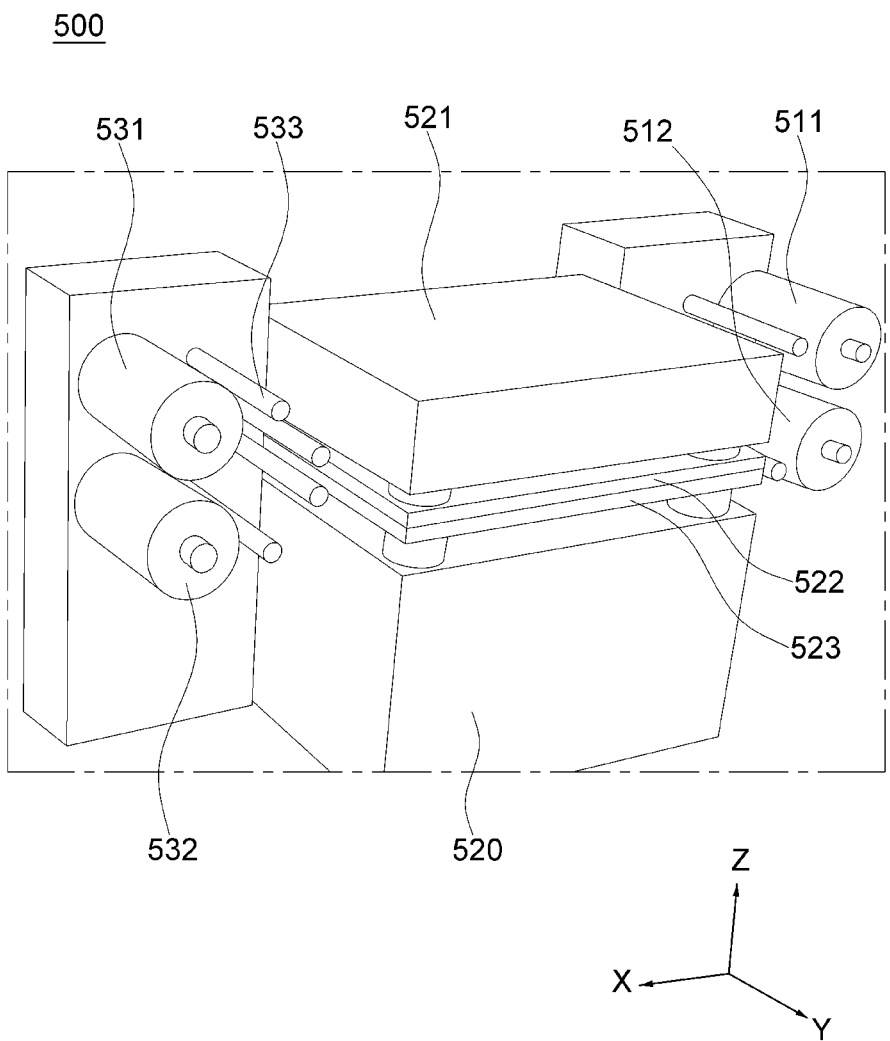
FIG. 18 is a perspective view schematically illustrating the hot-press apparatus shown in FIG. 2.

According to an example, the hot-press apparatus 500 includes a protection film supply unit 510, a hot-press unit 520, and a protection film collecting unit 530 as shown in FIG. 18.

1) Protection Film Supply Unit

The protection film supply unit 510 is a part for supplying protection films to the top and bottom of the first composite board 30 that is automatically and continuously supplied by the transfer apparatus 400.

Figure 19:
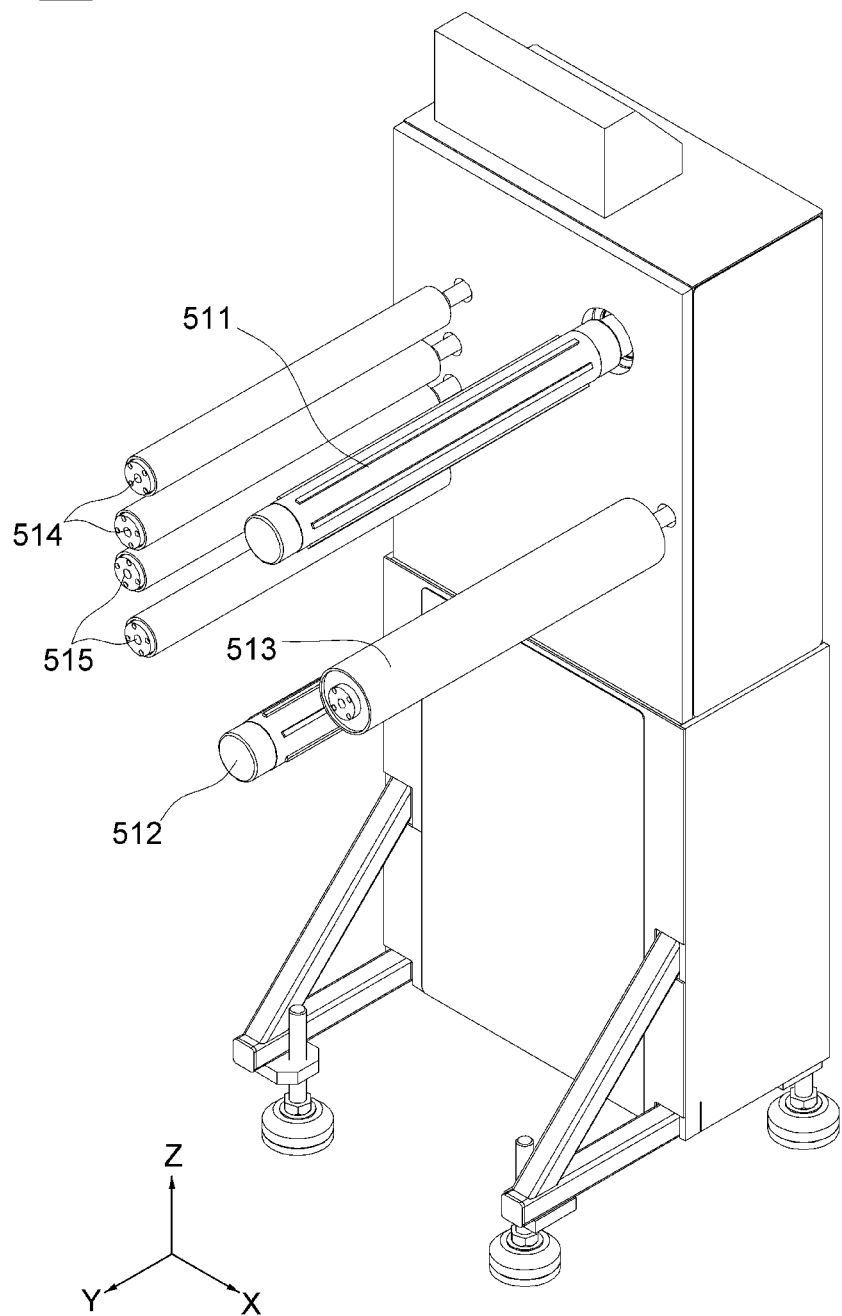
FIG. 19 is a perspective view illustrating a protection film supply unit in the hot-press apparatus shown in FIG. 18.

According to an example, the protection film supply unit 510 includes a first film supply roller part 511, a second film supply roller part 512, and a board guide roller part 513 as shown in FIG. 19.

The first film supply roller part 511 is an unwinder roller that supplies a first protection film 41 to the top of the first composite board 30 automatically and continuously supplied from the pre-bonding apparatus 300 by the transfer apparatus 400. The first film supply roller part 511 continuously supplies the first protection film 41 to the hot-press unit 520 according to the motor driving.

The second film supply roller part 512 an unwinder roller that is disposed to face the first film supply roller part 511 and supplies a second protection film 42 to the bottom of the first composite board 30 that is automatically and continuously supplied from the pre-bonding apparatus 300 by the transfer apparatus 400. The second film supply roller part 512 continuously supplies the second protection film 42 to the hot-press unit 520 according to the motor driving.

Here, the first and second protection films 41 and 42 may prevent the surface and/or inside of the first composite board 30 from being contaminated with foreign substances when hot-pressing the first composite board 30 by the hot-press unit 520, and prevent the resin leaking from the board from contaminating the hot-press unit 520. Therefore, the protection films 41 and 42 make it possible to increase the operating time and lifespan of the hot-press unit 520. The protection film 41 or 42 is not particularly limited as long as it is known in the art, and for example, it may be polyethylene terephthalate (PET) or the like.

The board guide roller part 513 a guide roller that is disposed between the first film supply roller part 511 and the second film supply roller part 512 and guides the first composite board 30 automatically and continuously supplied from the pre-bonding apparatus 300 by the transfer apparatus 400 to enter between the first film supply roller part 511 and the second film supply roller part 512.

In addition, if necessary, the protection film supply unit 510 may further include: a first film guide roller part 514 for guiding the first protection film 41 supplied from the first film supply roller part 511 to be easily disposed on top of the first composite board 30 entering between the first film supply roller part 511 and the second film supply roller part 512; and a second film guide roller part 515 for guiding the second protection film 42 supplied from the second film supply roller part 512 to be easily disposed on bottom of the first composite board 30 entering between the first film supply roller part 511 and the second film supply roller part 512. Each of the second and third film guide roller parts may be a plurality of guide rollers.

2) Hot-Press Unit

When the protection films 41 and 42 are supplied from the protection film supply unit 510 in the state of being disposed on top and bottom of the first composite board 30, respectively, the hot-press unit 520 hot-presses the same. As shown in FIG. 1, the first composite board 30, which is automatically and continuously supplied from the pre-bonding apparatus 300 by the transfer apparatus 400, has the first and second protection films 41 and 42 that are supplied from the protection film supply unit 510 and respectively disposed on top and bottom thereof before entering the hot-press unit as described above, and a 1b-composite board 50 in such a state is introduced into the hot-press unit 520 and hot-pressed, thereby discharging a 2a-composite board 60 from the hot-press unit 500. At this time, the 2a-composite board 60 includes the first protection film 41/the coverlay 11/the printed circuit board 20/the second protection film 42, and the coverlay 11 and the printed circuit board 20 is in a hot-pressed state.

For example, the hot-press unit 520 includes a hot-press housing part 521, an upper press part 522, and a lower press part 523 as shown in FIG. 18. However, it is not limited thereto, and any hot-press machine known in the art may be used without limitation.

Here, the upper press part 522 and the lower press part 523 are respectively disposed inside the hot-press housing part 521 to face each other. However, the upper press part 522 is vertically driven by a press driving part (not shown). The upper press part 522 and the lower press part 523 are respectively equipped with a heater block having a built-in heating wire. Therefore, the upper press part 522 descends to hot-press the entire surface of the 1b-composite board 50 in a structure of the protection film 41/the first composite board 30/the protection film 42, which is stationed between the upper press part 522 and the lower press part 523.

At this time, the size of each of the upper press part 522 and the lower press part 523 of the present invention may be 1000 mm or less (specifically, about 200 to 1000 mm) in length in one direction (e.g., the X-axis direction), and may be 1000 mm or less (specifically, about 200 to 1000 mm) in length in a direction (e.g., the Y-axis direction) perpendicular to the one direction. Therefore, unlike the prior art, the present invention may continuously manufacture a large area 2A-composite board 60 by hot-pressing a large area 1b-composite board 50.

The hot-press unit 530 may perform preheating to a predetermined temperature and then perform hot-pressing. At this time, the preheating conditions and hot-pressing conditions are not particularly limited. According to an example, for example, the first composite board 50 may be preheated under a temperature condition of about 100~120° C. and then hot-pressed under the conditions such as a temperature of about 150 to 190° C., a surface pressure of about 10 to 100 kgf/cd, and a line pressure of 2 to 20 kN. In this case, the flow of the resin in the first composite board 50 may be maximized, thereby eliminating a void from the board hole.

3) Protection Film Collecting Unit

The protection film collecting unit 530, as shown in FIG. 1, collects the protection films 41 and 42 respectively laminated on top and bottom of the 2A-composite board 60 that is hot-pressed by and automatically and continuously supplied from the hot-press unit 520.

The protection film collecting unit 530 may include a first film collecting roller part 531 and a second film collecting roller part 532, and may further include a film collecting guide roller part 533 and/or a pair of ionizer parts (not shown) as necessary, as shown in FIG. 18.

The first film collecting roller part 531 is a rewinder roller that winds and collects the first protection film 41 disposed on top of the 2A-composite board 60 that is hot-pressed by and discharged from the hot-press unit 520. The first film collecting roller part 531 may continuously wind the first protection film 41 according to the motor driving.

The second film collecting roller part 532 is a rewinder roller that is disposed to face the first film collecting roller part 531 and collects the second protection film 42 disposed on bottom of the 2A-composite board 60 that is hot-pressed by and discharged from the hot-press unit 520. The second film collecting roller part 532 may continuously wind the second protection film 42 according to the motor driving.

As described above, the respective protection films 41 and 42 may be collected by the first film collecting roller part 531 and the second film collecting roller part 532 to be reused, thereby reducing manufacturing costs.

The film collecting guide roller part 533 is disposed between the hot-press unit 520 and the first and second film collecting roller parts 531 and 532. In this case, the film collecting guide roller part 533 may be a plurality of rollers for guiding the first protection film 41 and the second protection film 42 to the first film collecting roller part 531 and the second film collecting roller part 532 such that the first protection film 41 and the second protection film 42 may be easily collected from the 2A-composite board 60 discharged from the hot-press unit 520 by the first film collecting roller part 531 and the second film collecting roller part 532. The film collecting guide roller part 533 may adjust the vertical position thereof by a tension controller and a pressure control valve.

The pair of ionizer parts (not shown) is respectively disposed between the first film collecting roller part 531 and the second film collecting roller part 532 to prevent the generation of static electricity. Specifically, the pair of ionizer parts (not shown) is disposed between the first film collecting roller part 531 and the second film collecting roller part 532, and between the hot-press unit 520 and the first and second film collecting roller parts 531 and 532. In the present invention, the ionizer parts may prevent the generation of static electricity when each protection film is separated and collected from the second composite board 70, thereby reducing a defect rate of the board.

(6) Winding Apparatus

As shown in FIGS. 1 and 2, the winding apparatus 600 winds and collects the second composite board 70 discharged from the hot-press apparatus 500 together with inserted paper (not shown).

Figure 20:
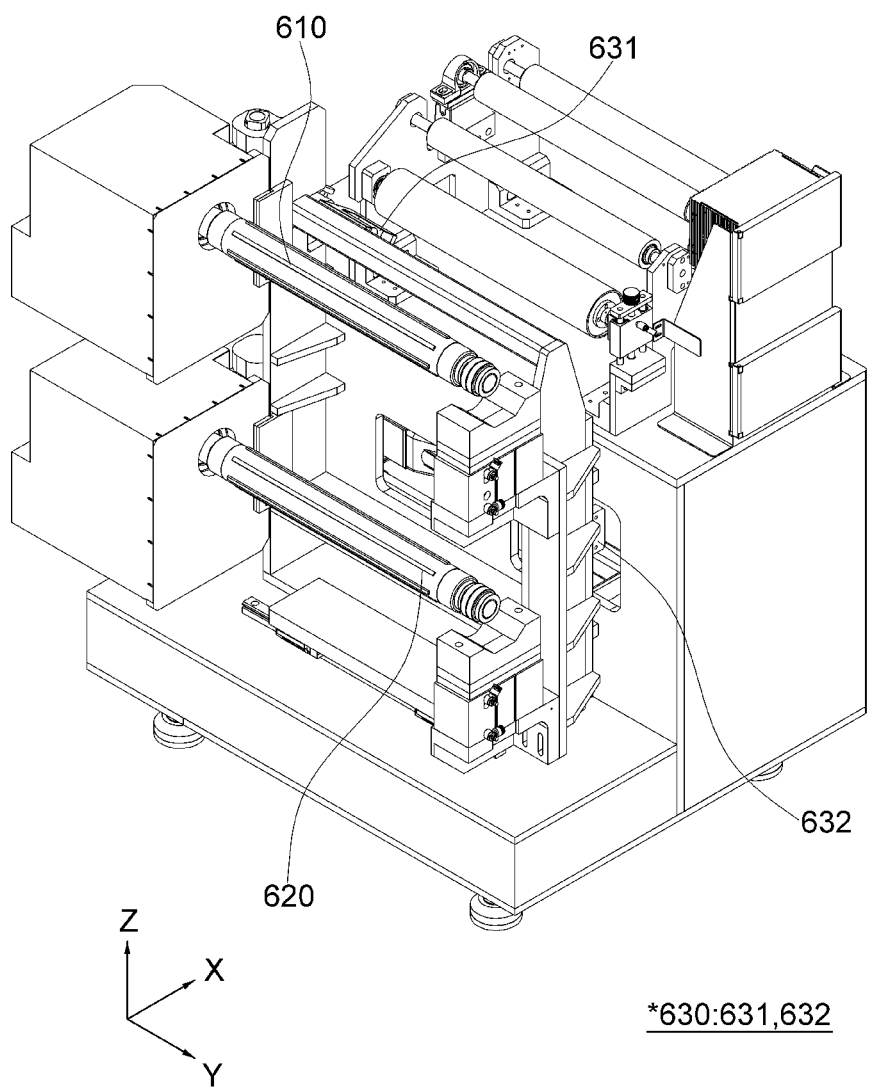
FIG. 20 is a perspective view illustrating the winding apparatus shown in FIG. 2.

According to an example, the winding apparatus 600 includes an inserted-paper supply roller part 610, a board collecting roller part 620, and an edge controller 630 as shown in FIG. 20.

The inserted-paper supply roller part 610 is an unwinder roller that supplies inserted paper (not shown) between the second composite boards 70 that are discharged from the hot-press apparatus 500 to be wound. The inserted-paper supply roller part 610 may maintain the tension of the inserted paper constant by a powder clutch, thereby adjusting the supply speed of the inserted paper to be constant.

The board collecting roller part 620 is a rewinder roller that collects the second composite board 70 discharged from the hot-press apparatus 500 together with the inserted paper (not shown). Since the tension of the collected board is kept constant by a load cell and a powder clutch, the board collecting roller part 620 may wind the second composite board 70 and the inserted paper (not shown) at a constant speed.

The edge controller 630 adjusts the position of the board collecting roller part 620 depending on the edge positions of the second composite board 70 and the inserted paper (not shown) wound by the board collecting roller part 620. According to an example, the edge controller 630 may include: a sensor 631 (e.g., an ultrasonic sensor) for detecting the left and right movement of the second composite board 70 such that the edge of the second composite board 70 is evenly wound around the board collecting roller part 620 when the second composite board 70 and the inserted paper (not shown) are laminated and wound; a control circuit (not shown) for adjusting the left and right movement of the board collecting roller part 620 by comparing a signal input by the sensor 631 with a predetermined signal and adjusting the amount of amplification; and an actuator (not shown) for adjusting the edge of the second composite board 70 to be corrected to a predetermined position according to the signal applied by the control circuit.

Hereinafter, a process of manufacturing a composite board in a roll-to-roll method in a system of manufacturing a composite board according to the present invention will be described in detail with reference to FIGS. 1 to 20.

According to an example of the present invention, a method of manufacturing a composite board includes a coverlay supply step of supplying a coverlay from a coverlay supply apparatus; a printed circuit board supply step of supplying a printed circuit board from the printed circuit board supply apparatus; and a pre-bond step of pre-bonding the coverlay supplied in the coverlay supply step onto the printed circuit board supplied in the printed circuit board supply step to form a first composite board. When manufacturing such a composite board, the above-described system of manufacturing a composite board may be used.

According to another example of the present invention, a method of manufacturing a composite board includes: a coverlay supply step of supplying a coverlay from a coverlay supply apparatus; a printed circuit board supply step of supplying the printed circuit board from the printed circuit board supply apparatus; a pre-bond step of pre-bonding the coverlay supplied in the coverlay supply step onto the printed circuit board supplied in the printed circuit board supply step to form a first composite board; and a hot-press step of hot-pressing the first composite board formed in the pre-bond step to form a second composite board, wherein the supply amount of the first composite board is adjusted when supplying the first composite board formed in the pre-bond step to the hot-press step. When manufacturing such a composite board, the above-described system of manufacturing a composite board may be used.

(a) A Coverlay is Supplied from a Coverlay Supply Apparatus 100 (hereinafter, "step S100").

According to an example, step S100 includes: a step of cutting a coverlay in a coverlay film including a release substrate and the coverlay; and separating the cut coverlay film into the coverlay and the release substrate.

Specifically, a coverlay film 10 in which the coverlay 11 is laminated on the release substrate 12 is wound around the coverlay film supply roller part 111 in the form of a roll in the coverlay supply apparatus 100. When the coverlay film supply roller part 111 is unwound, the coverlay film 10 wound around the coverlay film supply roller part 111 is unwound and moves toward the cutting unit 120 while being guided by the first guide roller part 115. At this time, the coverlay film 10 is supplied with a constant tension by the first tension adjustment roller part 112. As the coverlay film 10 passes through the cutting unit 120, the coverlay 11 is cut at a predetermined interval.

Thereafter, the coverlay film 10 in which the coverlay 11 is cut to a predetermined length is separated into the coverlay 11, which is cut to a predetermined size, and the release substrate 12 by the separation unit 130. Specifically, a bent portion of a predetermined angle or more is formed in the traveling direction (collecting direction) of the release substrate 12 of the coverlay film 10 by the delamination plate part 131 of the separation unit 130, so that the cut coverlay 11 of the coverlay film 10 is separated from the release substrate 12 and supplied to the pre-bonding apparatus 300. Meanwhile, the release substrate 12 separated from the coverlay 11 is guided by the release substrate guide roller part 132 and collected by the release substrate collecting roller part 116.

(b) A Printed Circuit Board is Supplied from a Printed Circuit Board Supply Apparatus (hereinafter, "step S200").

Step S200 has no temporal sequence relationship with step S100.

The printed circuit board 20 is mounted to the printed circuit board supply roller part 210 in the form of a roll. Thereafter, the printed circuit board 20 is continuously released from the printed circuit board supply roller part 210 and guided and supplied to the aligning table unit 330 of the pre-bonding apparatus 300 by the second guide roller part 230 and the second tension adjustment roller part 240. At this time, the printed circuit board 20 is supplied with a constant tension by the second tension adjustment roller part 240. Meanwhile, inserted paper interposed between the printed circuit boards 20 wound around the printed circuit board supply roller part 210 is collected by the inserted-paper collecting roller part 220.

The printed circuit board 20 supplied from the printed circuit board supply roller part 210 may be cut or spliced with a new printed circuit board by the second splicing part 250.

In addition, when the printed circuit board 20 supplied from the printed circuit board supply roller part 210 is guided and supplied to the pre-bonding apparatus 300 by the second guide roller part 230 and the second tension adjustment roller part 240, foreign substances may be removed from the surface thereof by the second cleaning roller part 260.

(c) The Coverlay Supplied in step S100 is Pre-Bonded onto the Printed Circuit Board Supplied in Step S200 to Form a First Composite Board (hereinafter, "step S300").

According to an example, step S300 includes: a step of seating the coverlay supplied from the coverlay supply apparatus 100 on the seating table part 311 ("step S310"); a step of picking up the coverlay seated on the seating table part, and transferring and aligning the same onto the printed circuit board supplied from the printed circuit board supply apparatus ("step S320"); and a step of pre-bonding the aligned coverlay and printed circuit board to form a first composite board ("step S330").

In step S310, the coverlay 11 continuously supplied from the separation unit 130 of the coverlay supply apparatus 100 is transferred onto the seating table part 311 in the state in which one end thereof is clamped by the coverlay clamp part 314 of the coverlay seating unit 310 to be seated on the seating table part 311. At this time, the coverlay clamp part 314 is mounted to the transfer body part 313 to reciprocate above the seating table part 311. At this time, the seating table part 311 suction-holds and releases the seated coverlay 11 by a vacuum (negative pressure). However, since a plurality of vacuum regions are individually separated in the seating table part 311, vacuum suction sections may be configured depending on the size of the coverlay 11.

In step S320, the coverlay 11 seated on the seating table part 311 is picked up by the pickup transfer unit 320, and transferred and aligned onto the printed circuit board 20 supplied from the printed circuit board supply apparatus 200. Step S320 may further include: a step of aligning the position of the coverlay by photographing a mark position of the picked-up coverlay; and a step of aligning the position of the coverlay by photographing a mark position of the picked-up coverlay.

Specifically, the coverlay 11 seated on the seating table part 311 in a standby state is picked up by the pickup part 323 of the pickup transfer unit 320, and then the pickup transfer unit 320 moves to the aligning table part 331 of the aligning table unit 330 by the transfer part 322. At this time, the coverlay 11 picked up by the pickup transfer unit 320 also moves to the aligning table part 331, and then the coverlay 11 is detached from the pickup part 323 and aligned onto the printed circuit board 20 that is temporarily staying on the aligning table part 331. At this time, the first vision unit 350 photographs the pickup (mark) position of the coverlay 11 with respect to the pickup transfer unit 310, and compares the difference between the same and a predetermined position value to generate a first signal for aligning the position of the coverlay. In addition, the second vision unit (not shown) photographs the mark position of the printed circuit board 20 staying on the aligning table part 311, and compares the same with the mark position of the coverlay 11 picked up by the pickup transfer unit 320 to generate a second signal for aligning the position where the transferred coverlay 11 is to be pre-bonded. By aligning the pickup transfer unit 320 picking up the coverlay for moving up, down, left, and right, as well as rotating, by the first signal and the second signal, it is possible to improve pre-bond precision of the coverlay and the printed circuit board in the aligning table part 311.

In step S330, the coverlay 11 and the printed circuit board 20, which are aligned in the step S320, are pre-bonded to form a first composite board 30.

Specifically, the laminate of coverlay-printed circuit board formed in step S320 enters between the upper pre-bonding part 343 and the lower pre-bonding part 345 of the pre-bonding unit 340, and at this time, the upper pre-bonding part 343 drives up and down to surface-pre-bond the coverlay 11 and the printed circuit board 20. Thereafter, the first composite board 30 in which the coverlay and the printed circuit board are pre-bonded is automatically and continuously transferred into the hot-press apparatus 500 by the transfer apparatus 400.

(d) However, in the Present Invention, when Supplying the First Composite Board 30 Formed in the Above-Described Step S300 to the Hot-Press Apparatus 500 in Step S400, the Supply Amount of the First Composite Board 30 is Adjusted.

The pre-bonding time of the pre-bonding apparatus 300 in the above-described step S300 is shorter than the hot-pressing process time of the hot-press apparatus 500 (step S400) in step S400. Therefore, in the present invention, the supply speed of the first composite board 30 from the pre-bonding apparatus 300 to the press apparatus 500 is adjusted according to the vertical movement of the transfer clamp part 450 of the transfer apparatus 400 disposed between the pre-bonding apparatus 300 and the hot-press apparatus 500, thereby adjusting the supply amount of the first composite board 30.

Specifically, in step S300, the first composite board 30 is automatically and continuously discharged from the pre-bonding unit 340 of the pre-bonding apparatus 300 at a constant speed. However, the pre-bonding process time in the pre-bonding unit 340 is shorter than the hot-pressing process time in the hot-press unit 520 of the hot-press apparatus 500. Accordingly, the first composite board 30 discharged from the pre-bonding unit 340 is temporarily stopped while being clamped by the transfer clamp part 450 of the transfer apparatus 400 by the time difference between the pre-bonding process in the pre-bonding unit 340 and the hot-pressing process in the hot-press unit 520 of the hot-press apparatus 500 so as not to be supplied to the hot-press apparatus 500.

Thereafter, when the hot-pressing process by the hot-press apparatus 500 is completed in step S300, the transfer clamp part 450 is driven downwards to a configured height along the rail parts 440 by the clamp driving part 460, and the first composite board 30 clamped by the transfer clamp part 450 also moves downwards along with the same. At this time, the first composite board 30 is transferred into the hot-press apparatus 500 at a faster speed by a configured driving speed of the transfer clamp part 450 than the speed discharged from the pre-bonding apparatus 300 in step S300.

Then, when the hot-pressing process is performed on the first composite board 30 transferred into the hot-press apparatus 500, the transfer clamp part 450 unclamps the first composite board 30 discharged from the pre-bonding apparatus 300 and is driven upwards to a configured height along the rail parts 440, and then clamps again the first composite board 30 discharged at a constant speed from the pre-bonding unit 340 to station the same. Thereafter, the aforementioned up-and-down driving of the transfer clamp part 450 repeats.

Through the above process, in the present invention, the transfer speed of the first composite board from the pre-bonding apparatus 300 to the hot-press apparatus 500 is adjusted, thereby automatically adjust the supply amount of the first composite board 30 transferred from the pre-bonding apparatus 300 to the hot-press apparatus 500.

(e) The First Composite Board 30, which is Formed in the Step S300 and whose Supply Amount is Controlled by the Transfer Apparatus 400, is Hot-Pressed to form a Second Composite Board 70 (hereinafter, "step S400").

According to an example, step S400 may include: a step of supplying protection films 41 and 42 to top and bottom of the first composite board 30 formed in step S300, respectively; a step of hot-pressing the protection films 41 and 42 disposed on top and bottom of the first composite board 30 to form a 2A-composite board 60; and a step of collecting the protection films 41 and 42 respectively laminated on top and bottom of the 2A-composite board 60.

Specifically, the protection films 41 and 42 supplied from the protection film supply unit 510, 511, and 512 are disposed on top and bottom of the first composite board 30 formed in step S300. Thereafter, the first composite board 30 is hot-pressed by the hot-press unit 520 in the state in which the protection films 41 and 42 are disposed on the top and bottom thereof. At this time, the hot-pressing step is performed using the upper and lower press parts 522 and 523 having a length of 1000 mm or less (specifically, about 200 to 1000 mm) in one direction and a length of 1000 mm or less (specifically, about 200 to 1000 mm) in a direction perpendicular to the one direction to hot-press the entire surface of the first composite board of a large area at once, thereby obtaining the 2A-composite board 60. Thereafter, the protection films 41 and 42 are collected from the 2A-composite board 60, in which the coverlay and the printed circuit board are hot-pressed, by the protection film collecting unit 530, and a second composite board 70 may be discharged.

Thereafter, the second composite board 70 formed in step S400 is wound by the board collecting roller part 620 of the winding apparatus 600 together with inserted paper (not shown) to be collected. At this time, the position of the board collecting roller part 620 is adjusted depending on the edge position of the second composite board 70 wound around the board collecting roller part 620 by the edge controller 630 such that the edge of the second composite board 70 is evenly wound around the board collecting roller part 620.

The present invention described above is not limited to the above-described embodiments and the accompanying drawings, and encompasses various modifications and changes made by those skilled in the art without departing from the spirit and scope of the present invention described in the claims below.

The invention claimed is:

1. A system for manufacturing a composite board, the system comprising:
 a coverlay supply apparatus configured to supply a coverlay;
 a printed circuit board supply apparatus configured to supply a printed circuit board; and
 a pre-bonding apparatus configured to pre-bond the coverlay supplied from the coverlay supply apparatus onto the printed circuit board supplied from the printed circuit board supply apparatus, thereby discharging a first composite board,
 wherein the pre-bonding apparatus comprises:
  a coverlay seating unit on which the coverlay supplied from the coverlay supply apparatus is seated;
  a pickup transfer unit positioned to correspond to a position of the coverlay seating unit and configured to pick up the coverlay seated on the coverlay seating unit and transfer the same onto the printed circuit board supplied from the printed circuit board supply apparatus;
  an aligning table unit configured to align the coverlay transferred by the pickup transfer unit onto the printed circuit board supplied from the printed circuit board supply apparatus; and
  a pre-bonding unit configured to pre-bond the coverlay and the printed circuit board, which are aligned in the aligning table unit and automatically and continuously supplied from the aligning table unit,
 wherein the pickup transfer unit comprises:
  a pickup body part;
  a transfer part configured to reciprocate the pickup body part between the coverlay seating unit and the aligning table unit; and
  a pickup part supported by the pickup body part and configured to pick up the coverlay seated on the coverlay seating unit, and
 wherein the pre-bonding unit comprises
  a pre-bonding housing part,
  an upper support part disposed inside the pre-bonding housing part and configured to move up and down,
  an upper pre-bonding part mounted under the upper support part and configured to heat and press the entire surface of the coverlay and the printed circuit board aligned in the aligning table unit,
  a lower support part disposed inside the pre-bonding housing part to face the upper support part,
  a lower pre-bonding part mounted above the lower support part and configured to heat and press the entire surface of the coverlay and the printed circuit board aligned in the aligning table unit, and
  a driving part configured to move the upper support part up and down.

2. The system for manufacturing a composite board according to claim 1, wherein the coverlay supply apparatus comprises:
 a coverlay film supply unit configured to supply a coverlay film comprising a release substrate and the coverlay;
 a cutting unit configured to cut the coverlay in the coverlay film supplied from the coverlay film supply unit; and
 a separation unit configured to separate the coverlay film cut in the cutting unit into the coverlay and the release substrate.

3. The system for manufacturing a composite board according to claim 1, wherein the pre-bonding apparatus further comprises a first vision unit disposed under the pickup transfer unit so as to be adjacent to the coverlay seating unit and configured to photograph a mark position of the coverlay picked up by the pickup transfer unit and generate a first signal for aligning the position of the coverlay.

4. The system for manufacturing a composite board according to claim 3, wherein the pre-bonding apparatus further comprises a second vision unit disposed to face the aligning table unit and configured to photograph a mark position of the printed circuit board supplied to the aligning table unit and generate a second signal for aligning a position where the coverlay transferred by the pickup transfer unit is pre-bonded.

5. The system for manufacturing a composite board according to claim 1, wherein the coverlay seating unit comprises:
 a seating table part configured to suction-hold and release the coverlay supplied from the coverlay supply apparatus;
 a pair of rail parts respectively installed on both sides of the seating table part in a longitudinal direction of the seating table part;
 a transfer body part configured to reciprocate above the seating table part along the pair of rail parts;
 a coverlay clamp part disposed on the transfer body part and configured to clamp one end of the coverlay supplied from the coverlay supply apparatus; and
 a transfer body driving part configured to drive the transfer body part.

6. The system for manufacturing a composite board according to claim 5, wherein the seating table part comprises a plate member, a plurality of vacuum holes formed in the plate member, and a vacuum generation member located under the plate member and connected to the vacuum hole to generate a vacuum.

7. The system for manufacturing a composite board according to claim 5, wherein the coverlay clamp part is moved by the transfer body part while clamping the coverlay supplied from the coverlay supply apparatus to transfer the coverlay to the seating table part.

8. The system for manufacturing a composite board according to claim 1, wherein the pickup part comprises
 a first support member supported on the pickup body part,
 a second support member movably disposed on the first support member,
 a first pickup member mounted on the second support member,
 a third support member movably disposed on the first support member and spaced apart from the second support member,
 a second pickup member mounted on the second support member,
 a gap adjustment member configured to adjust a separation distance between the second support member and the third support member, and
 a transfer member configured to move the first pickup member and the second pickup member up and down.

9. The system for manufacturing a composite board according to claim 8, wherein the pickup part further comprises an auxiliary pre-bond member mounted to at least one of the second support member and the third support member and configured to pre-bond the picked-up coverlay to the printed circuit board.

10. The system for manufacturing a composite board according to claim 8, wherein the pickup part further comprises a rotational driving member configured to rotate the support member about a vertical direction of the printed circuit board.

11. The system for manufacturing a composite board according to claim 1, wherein the aligning table unit comprises:
an aligning table part on which the printed circuit board supplied from the printed circuit board supply apparatus is mounted such that the coverlay transferred by the pickup transfer unit is seated on the printed circuit board;
an auxiliary pre-bonding part installed above the aligning table part so as to move up and down and configured to pre-bond a portion of the coverlay transferred by the pickup transfer unit to the printed circuit board mounted on the aligning table part; and
an auxiliary pre-bond transfer part configured to move the auxiliary pre-bonding part up and down.

12. The system for manufacturing a composite board according to claim 11, wherein the aligning table part comprises
a plate member,
a plurality of vacuum holes formed in the plate member, and
a vacuum generation member located under the plate member and connected to the vacuum hole to generate a vacuum.

13. A method for manufacturing a composite board, the method comprising:
a coverlay supply step of supplying a coverlay from a coverlay supply apparatus;
a printed circuit board supply step of supplying a printed circuit board from a printed circuit board supply apparatus; and
a pre-bond step of pre-bonding the coverlay supplied in the coverlay supply step onto the printed circuit board supplied in the printed circuit board supply step to form a first composite board,
wherein the pre-bond step comprises the steps of:
vacuum sucking the coverlay supplied from the coverlay supply apparatus to seat the same on the coverlay seating unit;
picking up the coverlay seated on the coverlay seating unit with the pickup transfer unit, and transferring and aligning the same onto the printed circuit board supplied from the printed circuit board supply apparatus; and
forming the first composite board by pre-bonding the coverlay and the printed circuit board, which are aligned in the coverlay seating unit and automatically and continuously supplied from the aligning table unit, using the pre-bonding unit,
wherein the pickup transfer unit comprises:
a pickup body part;
a transfer part configured to reciprocate the pickup body part between the coverlay seating unit and the aligning table unit; and
a pickup part supported by the pickup body part and configured to pick up the coverlay seated on the coverlay seating unit, and
wherein the pre-bonding unit comprises
a pre-bonding housing part,
an upper support part disposed inside the pre-bonding housing part and configured to move up and down,
an upper pre-bonding part mounted under the upper support part and configured to heat and press the entire surface of the coverlay and the printed circuit board aligned in the aligning table unit,
a lower support part disposed inside the pre-bonding housing part to face the upper support part,
a lower pre-bonding part mounted above the lower support part and configured to heat and press the entire surface of the coverlay and the printed circuit board aligned in the aligning table unit, and
a driving part configured to move the upper support part up and down.

14. The method for manufacturing a composite board according to claim 13, further comprising the steps of:
aligning the position of the coverlay by photographing a mark position of the picked-up coverlay; and
photographing a mark position of the printed circuit board supplied from the printed circuit board supply apparatus, comparing the mark position of the coverlay with the mark position of the printed circuit board, and aligning a position where the coverlay is pre-bonded onto the printed circuit board.

15. The method for manufacturing a composite board according to claim 13, wherein the aligned coverlay and printed circuit board are surface-pre-bonded.

16. The method for manufacturing a composite board according to claim 13, wherein the coverlay supply step comprises the steps of:
cutting a coverlay in a coverlay film comprising a release substrate and the coverlay; and
separating the cut coverlay film into the coverlay and the release substrate.

* * * * *